(12) United States Patent
Kasahara et al.

(10) Patent No.: US 11,331,888 B2
(45) Date of Patent: May 17, 2022

(54) COMPOSITE FILM FOR ELECTRONIC DEVICES USING HIGH FREQUENCY BAND SIGNALS, PRINTED WIRING BOARD AND MANUFACTURING METHOD THEREFOR

(71) Applicant: HITACHI CHEMICAL COMPANY, LTD., Tokyo (JP)

(72) Inventors: Aya Kasahara, Tokyo (JP); Tetsurou Iwakura, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 414 days.

(21) Appl. No.: 16/318,389

(22) PCT Filed: Jul. 19, 2017

(86) PCT No.: PCT/JP2017/026132
§ 371 (c)(1),
(2) Date: Jan. 17, 2019

(87) PCT Pub. No.: WO2018/016534
PCT Pub. Date: Jan. 25, 2018

(65) Prior Publication Data
US 2019/0283373 A1 Sep. 19, 2019

(30) Foreign Application Priority Data

Jul. 20, 2016 (JP) .............................. JP2016-142421
Jul. 20, 2016 (JP) .............................. JP2016-142867
(Continued)

(51) Int. Cl.
*B32B 27/08* (2006.01)
*B32B 27/28* (2006.01)
(Continued)

(52) U.S. Cl.
CPC .............. *B32B 27/08* (2013.01); *B32B 27/00* (2013.01); *B32B 27/20* (2013.01); *B32B 27/281* (2013.01);
(Continued)

(58) Field of Classification Search
CPC ...................................................... H05K 1/024
See application file for complete search history.

(56) References Cited

U.S. PATENT DOCUMENTS

2017/0051109 A1  2/2017  Mizuno et al.

FOREIGN PATENT DOCUMENTS

| CN | 1422315 A | 6/2003 |
| JP | H06-192478 A | 7/1994 |
| JP | 2001-233945 A | 8/2001 |
| JP | 2002-184793 A | 6/2002 |

(Continued)

OTHER PUBLICATIONS

Translation of JP2013127014 (Year: 2013).*
Translation of JP2014101398 (Year: 2014).*

*Primary Examiner* — Ian A Rummel
(74) *Attorney, Agent, or Firm* — Fitch, Even, Tabin & Flannery, LLP

(57) ABSTRACT

A composite film for electronic device using high frequency band signals, which is low in dielectric tangent, excellent in embedding properties relative to unevenness of a circuit, etc., and excellent in surface smoothness, and has high adhesion to plated copper is provided; and a printed wiring board containing a cured material of the composite film for electronic device and a method of producing the printed wiring board are also provided. Specifically, the composite film for electronic device is a composite film for electronic device using high frequency band signals, including a layer A having a minimum melt viscosity at 80 to 150° C. of 100 to 4,000 Pa·s; and a layer B having a minimum melt (Continued)

viscosity at 80 to 150° C. of 50,000 Pa·s or more. The composite film for electronic device is low in thermal expansion properties and excellent in handling properties of film.

12 Claims, 1 Drawing Sheet

(30) Foreign Application Priority Data

Jul. 20, 2016 (JP) .............................. JP2016-142868
Jul. 20, 2016 (JP) .............................. JP2016-142869

(51) Int. Cl.
| | |
|---|---|
| *B32B 27/20* | (2006.01) |
| *B32B 27/38* | (2006.01) |
| *H05K 1/02* | (2006.01) |
| *H05K 1/03* | (2006.01) |
| *H05K 3/46* | (2006.01) |
| *H05K 3/10* | (2006.01) |
| *B32B 27/00* | (2006.01) |
| *B32B 27/34* | (2006.01) |

(52) U.S. Cl.
CPC .............. *B32B 27/34* (2013.01); *B32B 27/38* (2013.01); *H05K 1/024* (2013.01); *H05K 1/03* (2013.01); *H05K 1/0373* (2013.01); *H05K 3/108* (2013.01); *H05K 3/46* (2013.01); *H05K 3/4655* (2013.01); *B32B 2457/08* (2013.01); *H05K 2201/012* (2013.01); *H05K 2201/0154* (2013.01); *H05K 2201/068* (2013.01)

(56) References Cited

FOREIGN PATENT DOCUMENTS

| | | | |
|---|---|---|---|
| JP | 2005-039247 | A | 2/2005 |
| JP | 2007-087982 | A | 4/2007 |
| JP | 2008-031193 | A | 2/2008 |
| JP | 2009-188163 | A | 8/2009 |
| JP | 2009-231222 | A | 10/2009 |
| JP | 2009-231240 | A | 10/2009 |
| JP | 2009-270054 | A | 11/2009 |
| JP | 2009-280758 | A | 12/2009 |
| JP | 2011-040493 | A | 2/2011 |
| JP | 2012-255058 | A | 12/2012 |
| JP | 2013-045806 | A | 3/2013 |
| JP | 2013-127014 | A | 6/2013 |
| JP | 2014-120687 | A | 6/2014 |
| JP | 2014-136779 | A | 7/2014 |
| JP | 2014-152309 | A | 8/2014 |
| JP | 2014-205755 | A | 10/2014 |
| JP | 2014-218600 | A | 11/2014 |
| JP | 2014-240456 | A | 12/2014 |
| JP | 2015-003982 | A | 1/2015 |
| JP | 2015-010230 | A | 1/2015 |
| JP | 2015-010231 | A | 1/2015 |
| JP | 2015-224304 | A | 12/2015 |
| JP | 2016-009763 | A | 1/2016 |
| JP | 2016-017091 | A | 2/2016 |
| JP | 2016-074849 | A | 5/2016 |
| JP | 2016-092106 | A | 5/2016 |
| JP | 2017-008204 | A | 1/2017 |
| JP | 2017-036377 | A | 2/2017 |
| JP | 2017-101138 | A | 6/2017 |
| JP | 2017-119846 | A | 7/2017 |
| JP | 2017-177461 | A | 10/2017 |
| JP | 2017-179058 | A | 10/2017 |
| TW | 201542621 | A | 11/2015 |
| TW | 201613991 | A | 4/2016 |
| WO | 2015/152427 | A1 | 10/2015 |
| WO | 2016-047357 | A1 | 3/2016 |

* cited by examiner

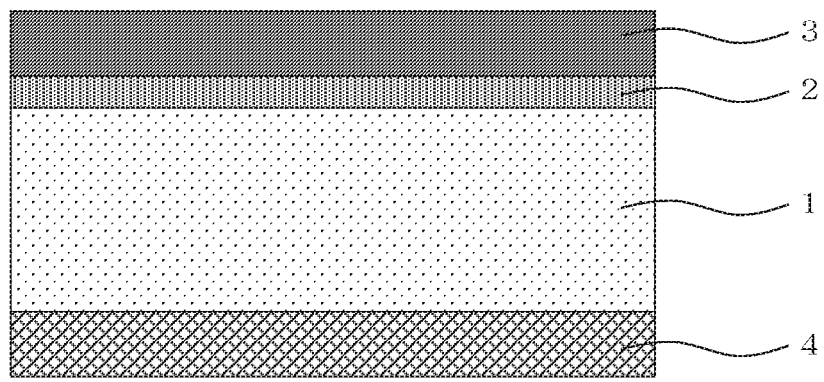

COMPOSITE FILM FOR ELECTRONIC DEVICES USING HIGH FREQUENCY BAND SIGNALS, PRINTED WIRING BOARD AND MANUFACTURING METHOD THEREFOR

CROSS-REFERENCE TO RELATED APPLICATIONS

This application is a U.S. national phase application filed under 35 U.S.C. § 371 of International Application No. PCT/JP2017/026132, filed Jul. 19, 2017, designating the United States, which claims benefit from Japanese Patent Application 2016-142421, filed Jul. 20, 2016, Japanese Patent Application 2016-142867, filed Jul. 20, 2016, Japanese Patent Application 2016-142868, filed Jul. 20, 2016, and Japanese Patent Application 2016-142869, filed Jul. 20, 2016 which are hereby incorporated herein by reference in their entirety.

TECHNICAL FIELD

The present invention relates to a composite film for electronic device using high frequency band signals and to a printed wiring board and a method of producing same.

BACKGROUND ART

In recent years, miniaturization, weight reduction, multi-functionalization, and so on of electronic devices are much advanced. Following this, LSI (large scale integration) and high integration of chip components, etc. are advanced, and forms thereof are rapidly changed to a multi-pin or miniaturized form. For this reason, in order to improve a mounting density of electronic devices, the development of fine wiring of multi-layered printed wiring boards is advanced. As the multi-layered printed wiring boards which are in agreement with these demands, multi-layered printed wiring boards having a build-up structure using a glass cloth-free insulating resin film as an insulating layer (hereinafter also referred to as "build-up layer") in place of a prepreg are becoming the main current as a printed wiring board suited for miniaturization, weight reduction, and microfabrication.

As for the build-up layer, in order to improve the processing dimensional stability and also to reduce the amount of warpage after mounting a semiconductor, reduction in thermal expansion is demanded. As one of methods of reducing the thermal expansion of the build-up layer, a method in which an inorganic filler is highly filled is exemplified. For example, by incorporating a silica filler in an amount of 40% by mass or more in the build-up layer, it is contemplated to reduce the thermal expansion of the build-up layer (see PTLs 1 to 3).

CITATION LIST

Patent Literature

PTL 1: JP 2007-87982 A
PTL 2: JP 2009-280758 A
PTL 3: JP 2014-136779 A

SUMMARY OF INVENTION

Technical Problem

In recent years, computers and information and communication equipment are towards high performance and high functionality more and more, and in order to process a large quantity of data at a high speed, processed signals tend to become higher in frequency. In particular, as for a frequency domain of radio waves used for mobile phones and satellite broadcasting, a high-frequency domain of a GHz band is used. In order to suppress a transmission loss to be caused due to high frequency, as organic materials to be used in a high-frequency domain, materials with low dielectric constant and dielectric tangent are desired.

In addition, in the build-up layer, embedding properties relative to unevenness of a circuit, etc. (hereinafter sometimes referred to simply as "embedding properties"), surface smoothness, and high adhesion to plated copper are required. However, in the materials having an inorganic filler highly filled therein, as described in PTLs 1 to 3, it is generally difficult to obtain surface flatness and high adhesion to plated copper.

In view of the foregoing circumstances, the present invention has been made, and one problem [I] thereof is to provide a composite film for electronic device using high frequency band signals, which is low in dielectric tangent, excellent in embedding properties relative to unevenness of a circuit, etc., and excellent in surface smoothness, and has high adhesion to plated copper; and to provide a printed wiring board containing a cured material of the composite film for electronic device and a method of producing the printed wiring board (such will be sometimes referred to as "problem [I]").

Another problem [II] of the present invention is to provide, as an insulating resin material capable of being used as the composite film for electronic device using high frequency band signals, an insulating resin material which makes low dielectric tangent and low thermal expansion properties compatible with each other and which is low in minimum melt viscosity and small in change of minimum melt viscosity with time; and to provide a resin film for interlayer insulation using the insulating material and a method of producing same, a composite film and a method of producing same, and a printed wiring board and a method of producing same (such will be sometimes referred to as "problem [II]").

A still another problem [III] of the present invention is to provide, as a thermosetting resin composition capable of being used as the composite film for electronic device using high frequency band signals, a thermosetting resin composition which is low in dielectric tangent and excellent in handling properties when formed into a film and in which the surface after desmear treatment is smooth and reveals high adhesion to plated copper; and to provide a resin film for interlayer insulation using the thermosetting resin composition, a composite film, and a printed wiring board and a method of producing same (such will be sometimes referred to as "problem [III]").

Solution to Problem

In order to solve the aforementioned problems, the present inventors made extensive and intensive investigations. As a result, it has been found that a composite film having a layer A having a minimum melt viscosity in a specified range at a predetermined temperature and a layer B having a minimum melt viscosity having a specified value or more at a predetermined temperature is able to solve the aforementioned problems, thereby leading to accomplishment of the present invention.

Specifically, the present invention relates to the following [1] to [12].

[1] A composite film for electronic device using high frequency band signals, including:
a layer A having a minimum melt viscosity at 80 to 150° C. of 100 to 4,000 Pa·s; and
a layer B having a minimum melt viscosity at 80 to 150° C. of 50,000 Pa·s or more.

[2] The composite film for electronic device using high frequency band signals as set forth in the above [1], wherein a thickness of the layer B is from 1 to 5 μm.

[3] The composite film for electronic device using high frequency band signals as set forth in the above [1] or [2], where a total thickness of the layer A and the layer B is from 15 to 50 μm.

[4] The composite film for electronic device using high frequency band signals as set forth in any of the above [1] to [3], wherein the layer A contains a polyimide compound having a structural unit derived from a maleimide compound and a structural unit derived from a diamine compound; and an inorganic filler.

[5] The composite film for electronic device using high frequency band signals as set forth in the above [4], wherein the structural unit derived from a maleimide compound contains a structural unit derived from an aliphatic maleimide compound.

[6] A composite film for electronic device using high frequency band signals, including a layer containing an insulating resin material containing a thermosetting resin (A), an inorganic filler (B), and an elastomer (C), the insulating resin material containing from 0.5 to 5% by mass of a high-boiling solvent (X) relative to a solid content of the insulating resin material.

[7] A composite film for electronic device using high frequency band signals, including a layer containing a thermosetting resin composition containing a thermosetting resin (A), an inorganic filler (B), and a conjugated diene-based elastomer (C'), wherein a total amount of a 1,4-trans body and a 1,4-cis body is 90% or more on a basis of the whole amount of entire carbon-carbon double bonds of the conjugated diene-based elastomer (C').

[8] The composite film for electronic device using high frequency band signals as set forth in any of the above [1] to [7], wherein the layer B contains a polyfunctional epoxy resin and a phenolic hydroxy group-containing polybutadiene-modified polyamide resin.

[9] The composite film for electronic device using high frequency band signals as set forth in any of the above [1] to [8], which exhibits a dielectric tangent at 5 GHz of 0.005 or less in terms of a cured material thereof.

[10] A printed wiring board including a cured material of the composite film for electronic device as set forth in any of the above [1] to [9].

[11] A method of producing a printed wiring board, including a step of laminating the composite film for electronic device as set forth in any of the above [1] to [9] on one surface or both surfaces of a base material.

[12] A method of producing a printed wiring board, including:
a step of using the composite film for electronic device as set forth in any of the above [1] to [9] and sticking the side of the layer A of the composite film for electronic device onto a board having a difference in level on a surface thereof due to a circuit or a component, to fill the difference in level;
a step of curing the layer A and the layer B of the composite film for electronic device; and
a step of forming a circuit on a surface on the side of the layer B of the composite film for electronic device by a semi-additive method.

Advantageous Effects of Invention

In accordance with the present invention, [I] it is possible to provide a composite film for electronic device using high frequency band signals, which is low in dielectric tangent, excellent in embedding properties relative to unevenness of a circuit, etc., and excellent in surface smoothness, and has high adhesion to plated copper; and a printed wiring board including a cured material of the composite film for electronic device and a method of producing the printed wiring board.

In accordance with another embodiment of the present invention, [II] it is possible to provide, as an insulating resin material capable of being used as the composite film for electronic device using high frequency band signals, an insulating resin material which makes low dielectric tangent and low thermal expansion properties compatible with each other and which is low in minimum melt viscosity and small in change of minimum melt viscosity with time; and to provide a resin film for interlayer insulation using the insulating resin material and a method of producing same, a composite film and a method of producing same, and a printed wiring board and a method of producing same.

In accordance with a still another embodiment of the present invention, [III] it is possible to provide, as a thermosetting resin composition capable of being used as the composite film for electronic device using high frequency band signals, a thermosetting resin composition which is low in dielectric tangent and excellent in handling properties when formed into a film and in which the surface after desmear treatment is smooth and reveals high adhesion to plated copper; and to provide a resin film for interlayer insulation using the thermosetting resin composition, a composite film, and a printed wiring board and a method of producing same.

BRIEF DESCRIPTION OF DRAWING

FIG. 1 is a view schematically showing an embodiment of a composite film of the present invention.

DESCRIPTION OF EMBODIMENTS

Embodiments of the present invention are hereunder explained in detail. In the present specification, a numerical value range of X or more and Y or less (X and Y are each the real number) may be expressed as "X to Y". For example, a description of "0.1 to 2" denotes a numerical value range of 0.1 or more and 2 or less, and 0.1, 0.34, 1.03, 2, and the like are included in the foregoing numerical value range.

In the present specification, the "composite film" includes both a composite in which a resin composition to be contained is uncured and a composite film in which a resin composition to be contained is semi-cured (in a so-called B-stage state).

In the present specification, the term "composite" of the composite film means that the film is formed of plural resin layers, and so long as the foregoing embodiment is included, the film may further have other layer composed of a support, a protective film, etc.

The "interlayer insulating layer" as referred to in the present specification is a layer positioning between two conductor layers and serving to insulate the conductor layers. Examples of the "interlayer insulating layer" in the present specification include a cured material of a composite film. The term "layer" referred to in the present specification also includes one in which a part thereof is chipped and one in which a via or pattern is formed.

First of all, the embodiment for solving the problem [I] is explained.

[Composite Film for Electronic Device Using High Frequency Band Signals]

The present invention is concerned with a composite film for electronic device using high frequency band signals (hereinafter sometimes referred to simply as "composite film"), including:

a layer A having a minimum melt viscosity at 80 to 150° C. of 100 to 4,000 Pa·s (first resin layer); and a layer B having a minimum melt viscosity at 80 to 150° C. of 50,000 Pa·s or more (second resin layer).

For example, in the case of producing a multi-layered printed wiring board using the composite film of the present embodiment, the layer A is provided between a circuit board and an adhesive auxiliary layer and used for the purpose of insulating a conductor layer of the circuit board from a layer provided thereon. In addition, in the case where a through-hole, a via hole, or the like is present in the circuit board, the layer A also flows thereinto, to play a role for filling the inside of the hole.

In a printed wiring board of the present embodiment as mentioned later, the layer B is positioned between the layer A and a conductor layer and provided for the purpose of improving the adhesion to the conductor layer. By providing the layer B, not only a smooth surface is obtained, but also more excellent adhesive strength to the conductor layer to be formed by means of plating is obtained.

The composite film of the present invention includes the layer A and the layer B, and a support may be provided on a surface of the layer B on the side opposite to the layer A. In this case, a configuration of [(layer A)/(layer B)/(support)] is formed. Examples of the support include films of polyolefins, such as polyethylene, polypropylene, and polyvinyl chloride; films of polyesters, such as polyethylene terephthalate (hereinafter also referred to as "PET") and polyethylene naphthalate; and various plastic films, such as a polycarbonate film and a polyimide film. In addition, a metal foil, such as a copper foil and an aluminum foil, a release paper, and so on may also be used. The support and a protective film as mentioned later may be ones having been subjected to a surface treatment, such as a matting treatment and a corona treatment. In addition, the support may also be ones having been subjected to a release treatment with a silicone resin-based release agent, an alkyd resin-based release agent, a fluorine resin-based release agent, or the like.

Although a thickness of the support is not particularly limited, it is preferably 10 to 150 μm, and more preferably 25 to 50 μm.

The composite film of the present invention may be provided with a protective film. For example, there is enumerated an embodiment in which the protective film is provided on a surface of the layer A on the side opposite to the layer B. In this case, for example, configurations of [(protective film)/(layer A)/(layer B)], [(protective film)/(layer A)/(layer B)/(support)], and so on are formed.

Examples of the protective film include plastic films, such as a polytetrafluoroethylene film, a polyethylene terephthalate film, a polyethylene film, a polypropylene film, a polymethylpentene film, and a polyimide film. In addition, the protective film may be subjected to s surface treatment, such as primer coating, a UV treatment, a corona discharge treatment, a polishing treatment, an etching treatment, and a release treatment, as the need arises.

The aforementioned support may be used as the protective film.

The composite film of the present invention can be, for example, produced by a method in which the layer B is formed on the support, and the layer A is then formed on the layer B, and optionally, the protective layer is formed on the layer A. For the formation of the layer B, a varnish for layer B as mentioned later is coated on the support and then heated for drying, and a varnish for layer A as mentioned later is further coated thereon and then heated for drying, whereby the layer B can be formed. As for a method of coating the varnish, a coating device, such as a comma coater, a bar coater, a kiss coater, a roll coater, a gravure coater, and a die coater, can be used. It is preferred that such a coating device is properly selected according to the film thickness.

A drying condition after coating is not particularly limited, and it may be properly determined according to the kind of the solvent. For example, in the case of forming the layer A, a drying temperature is preferably 50 to 130° C., and more preferably 70 to 110° C. In the case of forming the layer A, a drying time can be, for example, set to 1 to 10 minutes. For example, in the case of forming the layer B, a drying temperature is preferably 50 to 150° C., and more preferably 100 to 145° C. In the case of forming the layer B, a drying time can be, for example, set to 1 to 10 minutes.

In the drying, the drying is performed in such a manner that the content of a volatile component (mainly an organic solvent) in the layer A or layer B after drying is preferably 10% by mass or less, and more preferably 6% by mass or less.

The composite film of the present invention may also be produced by preparing a film of the layer A and a film of the layer B, respectively and performing thermocompression bonding at a temperature of a softening temperature or higher or sticking with a laminator, etc.

In the composite film of the present invention, in order to embed an unevenness height c of the circuit, a thickness of the layer A is preferably 1c to 3c, more preferably 1c to 2c, and still more preferably 1.1c to 1.5c. When the thickness of the layer A is 1c or more, on the occasion of embedding the unevenness of the circuit, satisfactory embedding properties can be secured, and there is a tendency that a surface layer of the composite film after embedding is readily kept flat. On the other hand, when the thickness of the layer A is 3c or less, not only thinning of the board becomes easy, but also the amount of warpage tends to be reduced, and hence, such is preferred.

Specifically, in order to embed the unevenness height of the circuit, the thickness of the layer A is, for example, preferably 10 to 40 μm. The thickness of the layer A is more preferably 15 to 35 μm, and still more preferably 20 to 35 μm.

Meanwhile, the layer B is a layer which can be adapted to the semi-additive method. In order to secure surface flatness and to secure high adhesion to plated copper, a thickness of the layer B is preferably 1 to 10 μm, more preferably 1 to 7 μm, still more preferably 1 to 5 μm, yet still more preferably 1 to 3 μm, and even yet still more preferably 1.5 to 3 μm. When the thickness of the layer B is 1 μm or more, on the occasion of embedding in the unevenness of the circuit, not only the occurrence of the matter layer B is broken, so that the layer A is exposed on the surface is readily avoided, but also there is less concern that the layer B elutes in a desmear process and vanishes. On the other hand, when the thickness of the layer B is 5 μm or less, not only worsening of the surface flatness is readily suppressed, but also the board can be thinned, and hence, such is preferred.

When the thickness of the layer A is defined as a (μm), the thickness of the layer B is defined as b (μm), and a height of the circuit is defined as c (μm), it is preferred to regulate the composite film so as to satisfy a relation of not only (c≤a≤3c), (c≤a≤2c), or (c≤a≤1.5c), but also (1≤b≤10) or (1≤b≤5). The film satisfying this relation is able to make both satisfactory embedding properties and fine circuit formability compatible with each other.

Although a weight loss of the layer B after desmear is not particularly limited, it is preferably 1 g/m² or less. The weight loss after desmear can be, for example, measured by performing a roughening treatment of the layer B by the method described in the section of Examples and comparing the weights before and after the roughening treatment. The weight loss after desmear is more preferably 0.8 g/m² or less, and still more preferably 0.7 g/m² or less.

The minimum melt viscosity of the layer A at 80 to 150° C. is 100 to 4,000 Pa·s. So long as the minimum melt viscosity falls within this range, the layer A can be allowed to flow at 80 to 150° C., and such is preferred from the viewpoint of embedding properties. The minimum melt viscosity of the layer A at 80 to 150° C. is more preferably 500 to 2,000 Pa·s, and still more preferably 700 to 2,000 Pa·s. The minimum melt viscosity as referred to herein is a viscosity when the resin composition is melted before commencement of curing.

When the minimum melt viscosity at 80 to 150° C. is 100 Pa·s or more, the fluidity of the film does not become excessively large, the surface flatness of the composite film after embedding is readily kept, and the generation of scattering in thickness of the board can be suppressed. In addition, when it is 4,000 Pa·s or less, the fluidity becomes excellent, and the unevenness of the wiring is readily embedded.

On the other hand, the minimum melt viscosity of the layer B at 80 to 150° C. is 50,000 Pa·s or more. As for the layer B, the layer B not only keeps the thickness constant at the time of embedding the composite film in the circuit but also readily keeps the surface flatness of the composite film after embedding. From the same viewpoint, the minimum melt viscosity of the layer B at 80 to 150° C. is preferably 50,000 to 100,000 Pa·s, more preferably 50,000 to 75,000 Pa·s, still more preferably 60,000 to 75,000 Pa·s, and especially preferably 63,000 to 70,000 Pa·s.

The composite film of the present invention can be cured by heat or an active energy ray. Examples of the active energy ray include electromagnetic waves, such as an ultraviolet ray, a visible light ray, an infrared ray, and an X-ray; and particle beams, such as an α-ray, a γ-ray, and an electron beam. Of these, an ultraviolet ray is preferred.

An example of the composite film of the present invention is shown as a schematic cross-sectional view in FIG. 1. The composite film according to the present invention includes a layer A 1 and a layer B 2, and optionally, a support 3 and/or a protective film 4.

A distinct interface does not exist between the layer A 1 and the layer B 2, and for example, a part of the constituent components of the layer A 1 and a part of the constituent components of the layer B 2 may be present in a compatibilized and/or mixed state.

So long as the composite film of the present invention satisfies the aforementioned condition, though the components of each layer are not particularly limited, the components of the layer A and the layer B are hereunder explained as an example of the embodiments.

[Components of Layer A]

As the components of the layer A, there is enumerated a resin composition. As the resin composition, for example, a resin composition containing a polyimide compound (a1) having a structural unit derived from a maleimide compound and a structural unit derived from a diamine compound; and an inorganic filler (a2) is preferred, and in particular, it is more preferred that the content of the inorganic filler (a2) is 55% by volume or more relative to the solid content of the resin composition. The respective components are hereunder described in detail.

<Polyimide Compound (a1)>

The polyimide compound (a1) is one having a structural unit derived from a maleimide compound and a structural unit derived from a diamine compound. From the viewpoints of low dielectric tangent and excellent handling properties on the occasion of forming into a film, it is preferred that the maleimide compound includes an aliphatic maleimide compound. Namely, it is preferred that the structural unit derived from a maleimide compound contains a structural unit derived from an aliphatic maleimide compound. In the present invention, the aliphatic maleimide compound is one not containing an aromatic hydrocarbon group in any place in its molecule, and a maleimide compound containing an aromatic hydrocarbon group in somewhere in its molecule is referred to as an aromatic maleimide compound.

The aliphatic maleimide compound preferably has a carbon number between imide groups of 6 to 40, more preferably has an aliphatic hydrocarbon group having 6 to 40 carbon atoms between imide groups, still more preferably has an aliphatic hydrocarbon group having 7 to 30 carbon atoms between imide groups, and especially preferably has an aliphatic hydrocarbon group having 8 to 20 carbon atoms between imide groups. In addition, it is preferred that the number of N-substituted maleimide groups which the aliphatic maleimide compound has is at least two. When the polyimide compound (a1) having a structural unit derived from an aliphatic maleimide compound is used, there is a tendency that the dielectric tangent is low, and that the handling properties when formed into a film are excellent.

Examples of the aliphatic maleimide compound include 1,6-bismaleimido-(2,2,4-trimethyl)hexane and a pyrophosphate binder type long-chain alkyl bismaleimide. These may be used alone, or may be used in combination of two or more thereof. As for the aliphatic maleimide, 1,6-bismaleimido-(2,2,4-trimethyl)hexane is more preferred from the viewpoint that it is low in a coefficient of thermal expansion and high in a glass transition temperature.

In the case where the polyimide compound (a1) contains a structural unit derived from an aliphatic maleimide compound, the total content of the structural units derived from an aliphatic maleimide compound in the polyimide compound (a1) is preferably 0.5% by mass or more, and more preferably 1% by mass or more on a basis of the charged amount. Although an upper limit of the preferred content is not particularly limited, for example, it is preferably 40% by mass or less, more preferably 30% by mass or less, still more preferably 25% by mass or less, and especially preferably 20% by mass or less. By allowing the content of the structural unit derived from the component (a1) to fall within the aforementioned range, in the thermosetting resin composition of the present embodiment, there is a tendency that more excellent high frequency characteristics and handling properties of film are obtained.

The maleimide compound may include other maleimide compound than the aliphatic maleimide compound, and the foregoing maleimide compound is not particularly limited so long as it has two or more N-substituted maleimide groups. Examples thereof include bis(4-maleimidophenyl)methane, polyphenylmethane maleimide, bis(4-maleimidophenyl) ether, bis(4-maleimidophenyl)sulfone, 3,3'-dimethyl-5,5'-diethyl-4,4'-diphenylmethanebismaleimide, 4-methyl-1,3-phenylenebismaleimide, m-phenylenebismaleimide, and 2,2-bis[4-(4-maleimidophenoxy)phenyl]propane. These may be used alone, or may be used in combination of two or more thereof. Of these, 2,2-bis[4-(4-maleimidophenoxy)phenyl]propane is preferred from the viewpoints of adhesion to a conductor and mechanical characteristics.

The content of the structural unit derived from an aliphatic maleimide compound in the polyimide compound (a1) is preferably 5% by mass or more, and more preferably 10% by mass or more as expressed in terms of the charged amount. An upper limit thereof is not particularly limited and may be 100% by mass; however, it is preferably 80% by mass or less, more preferably 60% by mass or less, still more preferably 40% by mass or less, and especially preferably 30% by mass or less. When the content of the structural unit derived from an aliphatic maleimide compound falls within the aforementioned range, in the resin composition, there is a tendency that more excellent high frequency characteristics and handling properties of film are obtained.

The content of the structural unit derived from an aliphatic maleimide compound relative to the total content of the structural units derived from a maleimide compound is preferably 5 to 50% by mass, and more preferably 10 to 40% by mass as expressed in terms of the charged amount.

Examples of the structural unit derived from a maleimide compound include a group represented by the following general formula (1-1) and a group represented by the following general formula (1-2).

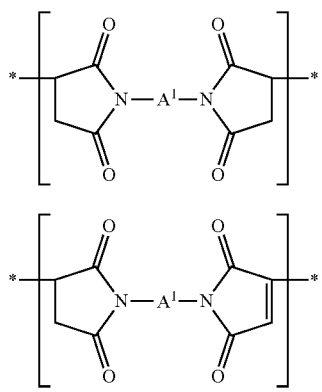

In the general formulae (1-1) and (1-2), $A^1$ represents a residue of the maleimide compound; and * represents a bonding site.

The residue as referred to herein indicates a structure of a portion in which a functional group subjected to bonding (the maleimide group in the maleimide compound) is eliminated from the raw material component.

The residue represented by $A^1$ is preferably a divalent group represented by the following general formula (2), (3), (4), or (5).

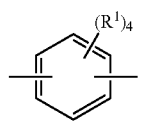

In the formula, $R^1$'s each independently represent a hydrogen atom, an aliphatic hydrocarbon group having 1 to 5 carbon atoms, or a halogen atom.

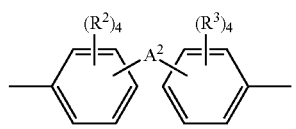

In the formula, $R^2$ and $R^3$ each independently represent a hydrogen atom, an aliphatic hydrocarbon group having 1 to 5 carbon atoms, or a halogen atom; and $A^2$ is an alkylene group or an alkylidene group each having 1 to 5 carbon atoms, an ether group, a sulfide group, a sulfonyl group, a carbonyloxy group, a ketone group, a single bond, or a group represented by the following general formula (3-1).

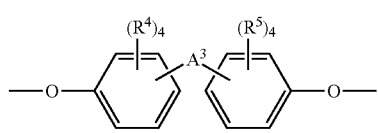

In the formula, $R^4$ and $R^5$ each independently represent a hydrogen atom, an aliphatic hydrocarbon group having 1 to 5 carbon atoms, or a halogen atom; and $A^3$ is an alkylene group having 1 to 5 carbon atoms, an isopropylidene group, an ether group, a sulfide group, a sulfonyl group, a carbonyloxy group, a ketone group, or a single bond.

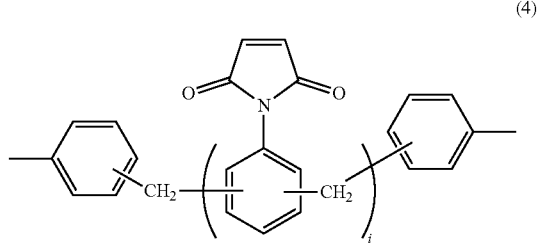

In the formula, i is an integer of 1 to 10.

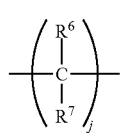

In the formula, $R^6$ and $R^7$ each independently represent a hydrogen atom or an aliphatic hydrocarbon group having 1 to 5 carbon atoms; and j is an integer of 1 to 8.

Examples of the aliphatic hydrocarbon group having 1 to 5 carbon atoms, which is represented by $R^1$ in the general formula (2), $R^2$ and $R^3$ in the general formula (3), $R^4$ and $R^5$ in the general formula (3-1), and $R^6$ and $R^7$ in the general formula (5), respectively, include a methyl group, an ethyl group, a n-propyl group, an isopropyl group, a n-butyl group, an isobutyl group, a t-butyl group, and a n-pentyl group. The aliphatic hydrocarbon group may be an aliphatic hydrocarbon group having 1 to 3 carbon atoms and may also be a methyl group.

Examples of the alkylene group having 1 to 5 carbon atoms, which is represented by $A^2$ in the general formula (3) and $A^3$ in the general formula (3-1), respectively, include a methylene group, an ethylene group, a propylene group, a butylene group, and a pentylene group.

Examples of the alkylidene group having 1 to 5 carbon atoms, which is represented by $A^2$ in the general formula (3), include an ethylidene group, a propylidene group, an isopropylidene group, a butylidene group, an isobutylidene group, and a pentylidene group.

The diamine compound is not particularly limited so long as it is a compound having two amino groups.

Examples of the diamine component include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobipheny, 3,3'-dihydroxybenzidine, 2,2-bis(3-amino-4-hydroxyphenyl)propane, 3,3'-dimethyl-5,5'-diethyl-4,4'-diphenylmethanediamine, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis{1-[4-(4-aminophenoxy)phenyl]-1-methylethyl}benzene, 1,4-bis{1-[4-(4-aminophenoxy)phenyl]-1-methylethyl}benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, bis[4-(4-aminophenoxy)phenyl]sulfone, bis[4-(3-aminophenoxy)phenyl]sulfone, and 9,9-bis(4-aminophenyl)fluorene. These may be used alone, or may be used in combination of two or more thereof.

Of these, 4,4'-diaminodiphenylmethane, 4,4'-diamino-3,3'-dimethyldiphenylmethane, 4,4'-diamino-3,3'-diethyldiphenylmethane, 2,2-bis(4-(4-aminophenoxy)phenyl)propane, 4,4'-[1,3-phenylenebis(1-methylethylidene)]bisaniline, and 4,4'-[1,4-phenylenebis(1-methylethylidene)]bisaniline are preferred from the viewpoints of solubility in an organic solvent, reactivity at the time of synthesis, and heat resistance. In addition, the diamine compound is preferably 3,3'-dimethyl-5,5'-diethyl-4,4'-diaminodiphenylmethane from the viewpoints of dielectric characteristics and low water absorptivity. In addition, from the viewpoints of high adhesion to a conductor and mechanical characteristics, 2,2-bis[4-(4-aminophenoxy)phenyl]propane is preferred. Furthermore, from the viewpoints of solubility in an organic solvent, reactivity at the time of synthesis, heat resistance, and high adhesion to a conductor and the viewpoint that excellent high frequency characteristics and low hygroscopicity can be revealed, 4,4'-[1,3-phenylenebis(1-methylethylidene)]bisaniline and 4,4'-[1,4-phenylenebis(1-methylethylidene)]bisaniline are preferred, with 4,4'-[1,3-phenylenebis(1-methylethylidene)]bisaniline being more preferred.

The content of the structural unit derived from a diamine compound in the polyimide compound (a1) is preferably 2 to 30% by mass, more preferably 5 to 20% by mass, and still more preferably 5 to 15% by mass as expressed in terms of the charged amount. By allowing the content of the structural unit derived from a diamine compound to fall within the aforementioned range, there is a tendency that more excellent high frequency characteristics, heat resistance, flame retardancy, and glass transition temperature are obtained.

Examples of the structural unit derived from a diamine compound include a group represented by the following general formula (6-1) and a group represented by the following general formula (6-2).

(6-1)

(6-2)

In the general formulae (6-1) and (6-2), $A^4$ represents a residue of the diamine compound; and * represents a bonding site.

The residue represented by $A^4$ is preferably a divalent group represented by the following general formula (7).

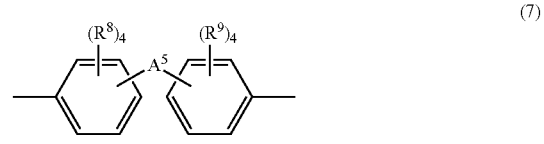

(7)

In the formula, $R^8$ and $R^9$ each independently represent a hydrogen atom, an aliphatic hydrocarbon group having 1 to 5 carbon atoms, an alkoxy group having 1 to 5 carbon atoms, a hydroxy group, or a halogen atom; and $A^5$ is an alkylene group or an alkylidene group each having 1 to 5 carbon atoms, an ether group, a sulfide group, a sulfonyl group, a carbonyloxy group, a ketone group, a fluorenylene group, a single bond, or a group represented by the following general formula (7-1) or the following general formula (7-2).

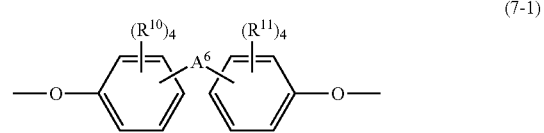

(7-1)

In the formula, $R^{19}$ and $R^{11}$ each independently represent a hydrogen atom, an aliphatic hydrocarbon group having 1 to 5 carbon atoms, or a halogen atom; and $A^6$ is an alkylene group having 1 to 5 carbon atoms, an isopropylidene group, a m- or p-phenylenediisopropylidene group, an ether group, a sulfide group, a sulfonyl group, a carbonyloxy group, a ketone group, or a single bond.

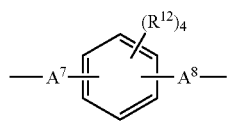

In the formula, $R^{12}$'s each independently represent a hydrogen atom, an aliphatic hydrocarbon group having 1 to 5 carbon atoms, or a halogen atom; and $A^7$ and $A^8$ are each an alkylene group having 1 to 5 carbon atoms, an isopropylidene group, an ether group, a sulfide group, a sulfonyl group, a carbonyloxy group, a ketone group, or a single bond.

The aliphatic hydrocarbon group having 1 to 5 carbon atoms, which is represented by $R^8$ and $R^9$ in the general formula (7), $R^{10}$ and $R^{11}$ in the general formula (7-1), and $R^{12}$ in the general formula (7-2), respectively, is explained in the same way as in the aliphatic hydrocarbon group having 1 to 5 carbon atoms, which is represented by $R^1$ in the general formula (2).

The alkylene group having 1 to 5 carbon atoms, which is represented by $A^5$ in the general formula (7), $A^6$ in the general formula (7-1), and $A^7$ and $A^8$ in the general formula (7-2), respectively, is explained in the same way as in the alkylene group having 1 to 5 carbon atoms, which is represented by $A^2$ in the general formula (3).

The alkylidene group having 1 to 5 carbon atoms, which is represented by $A^5$ in the general formula (7), is explained in the same way as in the alkylidene group having 1 to 5 carbon atoms, which is represented by $A^2$ in the general formula (3).

From the standpoints of solubility in an organic solvent, high frequency characteristics, high adhesion to a conductor, moldability of a film, and so on, it is preferred that the polyimide compound (a1) includes a polyaminobismaleimide compound represented by the following general formula (8).

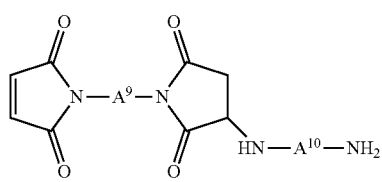

In the formula, $A^9$ is explained in the same way as in A1 in the general formula (1-1); and $A^{19}$ is explained in the same way as in $A^4$ in the general formula (6-1).

(Production Method of Polyimide Compound (a1))

The polyimide compound (a1) can be, for example, produced by allowing a maleimide compound and a diamine compound to react with each other in an organic solvent.

The organic solvent which is used on the occasion of producing the polyimide compound (a1) is not particularly limited, and a known solvent can be used. Although the organic solvent is not particularly limited, examples thereof include alcohols, such as methanol, ethanol, butanol, butyl cellosolve, ethylene glycol monomethyl ether, and propylene glycol monomethyl ether; ketones, such as acetone, methyl ethyl ketone, methyl isobutyl ketone, and cyclohexanone; aromatic hydrocarbons, such as toluene, xylene, and mesitylene; esters, such as methoxyethyl acetate, ethoxyethyl acetate, butoxyethyl acetate, and ethyl acetate; and amide-based solvents, such as N,N-dimethylformamide, N,N-dimethylacetamide, and N-methyl-2-pyrrolidone. These may be used alone, or may be used in combination of two or more thereof. Of these, methyl ethylene ketone, cyclohexanone, propylene glycol monomethyl ether, N,N-dimethylformamide, and N,N-dimethylacetamide are preferred from the viewpoint of solubility.

As for use amounts of the maleimide compound and the diamine compound on the occasion of producing the polyimide compound (a1), an equivalent ratio (Ta2/Ta1) between an —$NH_2$ group equivalent (Ta2) of the diamine compound and a maleimide group equivalent (Ta1) of the maleimide compound is preferably 0.05 to 10.0, more preferably 0.05 to 1.0, and still more preferably 0.1 to 0.8. By allowing the maleimide compound and the diamine compound to react with each other within the aforementioned range, there is a tendency that more excellent high frequency characteristics, heat resistance, flame retardancy, and glass transition temperature are obtained.

On the occasion of allowing the maleimide compound and the diamine compound to react with each other to produce the polyimide compound (a1), a reaction catalyst can also be used, as the need arises. Although the reaction catalyst is not particularly limited, examples thereof include acidic catalysts, such as p-toluenesulfonic acid; amines, such as triethylamine, pyridine, and tributylamine; imidazoles, such as methyl imidazole and phenyl imidazole; and phosphorus-based catalysts, such as triphenylphosphine. These may be used alone, or may be used in combination of two or more thereof. In addition, though the blending amount of the reaction catalyst is not particularly limited, for example, the reaction catalyst can be used in an amount ranging from 0.01 to 5.0 parts by mass based on 100 parts by mass of the total amount of the maleimide compound and the diamine compound.

The polyimide compound (a1) is obtained by charging predetermined amounts of the maleimide compound, the diamine compound, and the organic solvent, and optionally, the reaction catalyst and so on in a reactor and performing the Michael addition reaction. Although the reaction condition in this step is not particularly limited, for example, from the viewpoints of workability, such as a reaction rate, gelation suppression, and so on, a reaction temperature is preferably 50 to 160° C., and a reaction time is preferably 1 to 10 hours.

In this step, a solid content concentration of the reaction raw materials and a solution viscosity may be regulated by addition of the aforementioned organic solvent or concentration. Although the solid content concentration of the reaction raw materials is not particularly limited, for example, it is preferably 10 to 90% by mass, and more preferably 20 to 80% by mass. When the solid content concentration of the reaction raw materials is 10% by mass or more, the reaction rate does not become excessively slow, so that such is advantageous from the standpoint of production costs. In addition, when the solid content concentration of the reaction raw materials is 90% by mass or less, excellent solubility is obtained, stirring efficiency is excellent, and gelation is scarcely caused.

After producing the polyimide compound (a1), concentration may be performed by removing a part or the whole of the organic solvent, or dilution may be performed by adding an organic solvent, in conformity with the purpose. As the organic solvent which is additionally used, the organic solvents exemplified in the explanation of the production method of the polyimide compound (a1) are applicable.

Although a weight average molecular weight (Mw) of the polyimide compound (a1) is not particularly limited, for example, it is preferably 800 to 10,000, more preferably 800 to 8,000, still more preferably 800 to 5,000, especially preferably 1,000 to 5,000, and most preferably 1,500 to 4,000. The weight average molecular weight of the polyimide compound (a1) can be determined by the method described in the section of Examples.

(Content of Polyimide Compound (a1))

Although the content of the polyimide compound (a1) in the resin composition is not particularly limited, it is preferably 40 to 95% by mass, more preferably 60 to 95% by mass, and still more preferably 65 to 85% by mass relative to all of the resin components contained in the resin composition. By allowing the content of the polyimide compound (a1) to fall within the aforementioned range, there is a tendency that excellent insulation reliability, a low coefficient of thermal expansion, a high glass transition temperature, and an excellent dielectric tangent are obtained.

<Inorganic Filler (a2)>

Although the inorganic filler (a2) is not particularly limited, examples thereof include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. These may be used alone, or may be used in combination of two or more thereof. Of these, silica is preferred from the viewpoint of revealing lower thermal expansion.

Although the shape of the inorganic filler (a2) is not particularly limited, and for example, it may be spherical, fragmental, acicular, or platy, it is preferably spherical from the viewpoints of improvement in dispersibility in the resin composition, improvement in dispersibility in a resin varnish having the resin composition dissolved or dispersed in an organic solvent, improvement in fluidity to be caused due to a reduction of viscosity of a resin varnish, suppression of an increase of surface roughness of the insulating layer to be formed from the resin composition, and so on.

Although a volume average particle diameter of the inorganic filler (a2) is not particularly limited, for example, it is preferably 0.05 to 5 µm, more preferably 0.1 to 3 µm, and still more preferably 0.2 to 1 µm. When the volume average particle diameter of the inorganic filler (a2) is 5 µm or less, there is a tendency that on the occasion of forming a circuit pattern on the interlayer insulating layer, the formation of a fine pattern may be more stably performed. In addition, when the volume average particle diameter of the inorganic filler (a2) is 0.1 µm or more, there is a tendency that the heat resistance becomes more excellent.

The volume average particle diameter indicates a particle diameter at a point corresponding to 50% when a total volume of the particles is defined as 100%, and a cumulative frequency distribution curve by the particle diameter is determined, and it can be measured by a particle size distribution measurement device adopting the laser diffraction scattering method, or the like.

For the purpose of improving the dispersibility of the inorganic filler (a2) and the adhesion between the inorganic filler (a2) and the organic components in the resin composition, a coupling agent may be used in combination, as the need arises. The coupling agent is not particularly limited, and for example, various silane coupling agents and titanate coupling agents, and the like can be used. These may be used alone, or may be used in combination of two or more thereof. Of these, silane coupling agents are preferred. Examples of the silane coupling agent include an aminosilane-based coupling agent, an epoxysilane-based coupling agent, a phenylsilane-based coupling agent, an alkylsilane-based coupling agent, an alkenylsilane-based coupling agent, and a mercaptosilane-based coupling agent. Of these, from the viewpoint of improvement in dispersibility of the inorganic filler (a2) and the viewpoint of improvement in adhesion between the inorganic filler (a2) and the organic components, an aminosilane-based coupling agent is preferred.

In the case of using a coupling agent, though the use amount thereof is not particularly limited, for example, it is preferably 0.1 to 5 parts by mass, and more preferably 0.5 to 3 parts by mass based on 100 parts by mass of the inorganic filler (a2). When the use amount of the coupling agent falls within this range, advantages to be brought due to the use of the inorganic filler (a2) can be more effectively exhibited.

In the case of using a coupling agent, its addition system may be a so-called integral blending treatment system in which the inorganic filler (a2) is blended in the resin composition, and the coupling agent is then added. From the viewpoint of more effectively revealing the advantages of the inorganic filler (a2), the addition system may also be a system of previously subjecting the inorganic filler before blending to a surface treatment with the coupling agent in a dry or wet mode.

From the viewpoint of enhancing the dispersibility in the resin composition, it is preferred to use the inorganic filler (a2) in a state of slurry in which it is previously dispersed in an organic solvent. Although the organic solvent which is used for the slurry of the inorganic filler (a2) is not particularly limited, for example, the organic solvents exemplified in the aforementioned production method of the polyimide compound (a1) are applicable. These may be used alone, or may be used in combination of two or more thereof. In addition, of these organic solvents, methyl ethyl ketone, methyl isobutyl ketone, and cyclohexanone are preferred from the viewpoint of much more enhancing the dispersibility.

Although a solid content concentration of the slurry of the inorganic filler (a2) is not particularly limited, for example, from the viewpoints of settleability and dispersibility of the inorganic filler (a2), it is preferably 50 to 80% by mass, more preferably 60 to 80% by mass, and still more preferably 60 to 75% by mass.

Although the content of the inorganic filler (a2) can be properly selected according to the required characteristics and functions, it is preferably 55% by volume or more, more preferably 55 to 85% by volume, still more preferably 55 to 80% by volume, and especially preferably 55 to 75% by volume relative to the solid content of the resin composition. By allowing the content of the inorganic filler to fall within such a range, a low coefficient of thermal expansion can be revealed.

In the present specification, the solid content contained in the resin composition means a residue resulting from removal of the volatile component from the components constituting the resin composition.

<Elastomer (a3)>

The resin composition for the layer A may contain an elastomer (a3). Although the elastomer (a3) is not particularly limited, examples thereof include a polybutadiene-based elastomer, a styrene-based elastomer, an olefin-based elastomer, a urethane-based elastomer, a polyester-based elastomer, a polyamide-based elastomer, an acrylic elastomer, a silicone-based elastomer, and derivatives of these elastomers. These may be used alone, or may be used in combination of two or more thereof.

As the elastomer (a3), one having a reactive functional group at a molecular end or in a molecular chain can be used. As for the reactive functional group, for example, at least one selected from the group consisting of a maleic anhydride group, an epoxy group, a hydroxy group, a carboxy group, an amino group, an amide group, an isocyanate group, an acryl group, a methacryl group, and a vinyl group is preferred; from the standpoint of adhesive properties to a metal foil, at least one selected from a maleic anhydride group, an epoxy group, a hydroxy group, a carboxy group, an amino group, and an amide group is more preferred; and from the standpoint of dielectric characteristics, a maleic anhydride group is still more preferred. When the elastomer has such a reactive functional group, there is a tendency that compatibility with the resin is improved, and that on the occasion of forming an interlayer insulating layer, the separation between the inorganic filler (a2) and the resin components is suppressed. From the same viewpoint, the elastomer (a3) is preferably an elastomer modified with maleic anhydride.

As the polybutadiene-based elastomer, there are suitably exemplified structures including a 1,2-vinyl group and composed of a 1,4-trans body and a 1,4-cis body.

As the polybutadiene-based elastomer, from the viewpoints that compatibility with the resin is improved, and that on the occasion of forming an interlayer insulating layer, the separation between the inorganic filler (a2) and the resin components is suppressed, one having a reactive functional group is preferred, and a polybutadiene-based elastomer modified with an acid anhydride is especially preferred. Although the acid anhydride is not particularly limited, examples thereof include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride, and methyltetrahydrophthalic anhydride. Of these, maleic anhydride is preferred.

In the case where the elastomer (a3) is modified with an acid anhydride, the number of an acid anhydride-derived group contained in one molecule of the elastomer (a3) (hereinafter also referred to as "acid anhydride group") is preferably 1 to 10, more preferably 1 to 6, and still more preferably 2 to 5. When the number of the acid anhydride group is 1 or more in one molecule, there is a tendency that on the occasion of forming an interlayer insulating layer, the separation between the inorganic filler (a2) and the resin components is more suppressed. In addition, when the number of the acid anhydride group is 10 or less in one molecule, there is a tendency that the dielectric tangent of the resin composition becomes lower. In the case where the elastomer (a3) is modified with maleic anhydride, from the same viewpoint as mentioned above, the number of a maleic anhydride-derived group contained in one molecule of the elastomer (a3) (hereinafter also referred to as "maleic anhydride group") is preferably 1 to 10, more preferably 1 to 6, and still more preferably 2 to 5.

As the styrene-based elastomer, for example, there are suitably exemplified a styrene-butadiene-styrene block copolymer, a styrene-isoprene-styrene block copolymer, a styrene-ethylene-butylene-styrene block copolymer, and a styrene-ethylene-propylene-styrene block copolymer. In addition to styrene, examples of a component constituting the styrene-based elastomer include styrene derivatives, such as α-methylstyrene, 3-methylstyrene, 4-propylstyrene, and 4-cyclohexylstyrene.

Examples of the olefin-based elastomer include copolymers of an α-olefin having 2 to 20 carbon atoms, such as ethylene, propylene, 1-butene, 1-hexene, and 4-methyl-pentene, and suitably, examples thereof include an ethylene-propylene copolymer (EPR) and an ethylene-propylene-diene copolymer (EPDM). In addition, examples thereof include copolymers between the aforementioned α-olefin and a non-conjugated diene having 2 to 20 carbon atoms, such as dicyclopentadiene, 1,4-hexadiene, cyclooctadiene, methylene norbornene, ethylidene norbornene, butadiene, and isoprene. Furthermore, examples thereof include a carboxy-modified NBR in which methacrylic acid is copolymerized with a butadiene-acrylonitrile copolymer.

As the urethane-based elastomer, for example, there are suitably exemplified ones containing a hard segment composed of a short-chain diol and a diisocyanate and a soft segment composed of a polymeric (long-chain) diol and a diisocyanate.

Example of the polymeric (long-chain) diol include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene.neopentylene adipate). A number average molecular weight of the polymeric (long-chain) diol is preferably 500 to 10,000.

Examples of the short-chain diol include ethylene glycol, propylene glycol, 1,4-butanediol, and bisphenol A. A number average molecular weight of the short-chain diol is preferably 48 to 500.

Examples of the polyester-based elastomer include ones obtained by polycondensing a dicarboxylic acid or a derivative thereof with a diol compound or a derivative thereof.

Specific examples of the dicarboxylic acid include aromatic dicarboxylic acids, such as terephthalic acid, isophthalic acid, and naphthalenedicarboxylic acid, and aromatic dicarboxylic acids in which a hydrogen atom of an aromatic nucleus of such an aromatic dicarboxylic acid is substituted with a methyl group, an ethyl group, a phenyl group, etc.; aliphatic dicarboxylic acids having to 20 carbon atoms, such as adipic acid, sebacic acid, and dodecanedicarboxylic acid; and alicyclic dicarboxylic acids, such as cyclohexanedicarboxylic acid. These compounds may be used alone, or may be used in combination of two or more thereof.

Specific examples of the diol compound include aliphatic diols, such as ethylene glycol, 1,3-propanediol, 1,4-butanediol, 1,6-hexanediol, and 1,10-decanediol; alicyclic diols, such as 1,4-cyclohexanediol; and aromatic diols, such as bisphenol A, bis(4-hydroxyphenyl)methane, bis(4-hydroxy-3-methylphenyl)propane, and resorcin. These compounds may be used alone, or may be used in combination of two or more thereof.

As the polyester-based elastomer, there are suitably exemplified multi-block copolymers in which an aromatic polyester (for example, polybutylene terephthalate) moiety constitutes a hard segment component, and an aliphatic polyester (for example, polytetramethylene glycol) constitutes a soft segment component. The multi-block copolymer includes various grades according to differences in kind, ratio, and molecular weight of the hard segment and the soft segment. Specific examples thereof include "HYTREL (registered trademark)" (manufactured by Du Pont-Toray Co., Ltd.), "PELPRENE (registered trademark)" (manufactured by Toyobo Co., Ltd.), and "ESPEL (registered trademark)" (manufactured by Hitachi Chemical Company, Ltd.).

Examples of the polyamide-based elastomer include block copolymers in which the hard segment component is constituted of a polyamide, and the soft segment component is constituted of polybutadiene, a butadiene-acrylonitrile copolymer, a styrene-butadiene copolymer, polyisoprene, an ethylene-propylene copolymer, a polyether, a polyester, polybutadiene, a polycarbonate, a polyacrylate, a polymethacrylate, a polyurethane, a silicone rubber, etc.

Examples of the acrylic elastomer include polymers of a raw material monomer containing, as a main component, an acrylic acid ester. As the acrylic acid ester, there are suitably exemplified ethyl acrylate, butyl acrylate, methoxyethyl acrylate, and ethoxyethyl acrylate. In addition, those in which glycidyl methacrylate, allyl glycidyl ether, etc. is copolymerized as a crosslinking-site monomer may be used, and those in which acrylonitrile, ethylene, etc. is copolymerized may also be used. Specifically, examples thereof include an acrylonitrile-butyl acrylate copolymer, an acrylonitrile-butyl acrylate-ethyl acrylate copolymer, and an acrylonitrile-butyl acrylate-glycidyl methacrylate copolymer.

The silicone-based elastomer is an elastomer containing, as a main component, an organopolysiloxane, and for example, it is classified into a polydimethylsiloxane-based elastomer, a polymethylphenylsiloxane-based elastomer, and a polydiphenylsiloxane-based elastomer.

Of these elastomers, from the standpoints of heat resistance and insulation reliability, a styrene-based elastomer, a polybutadiene-based elastomer, an olefin-based elastomer, a polyamide-based elastomer, and a silicone-based elastomer are preferred; from the standpoint of dielectric characteristics, a polybutadiene-based elastomer and a styrene-based elastomer are more preferred, with a polybutadiene-based elastomer being still more preferred.

A weight average molecular weight of the elastomer (a3) is preferably 500 to 50,000, and more preferably 1,000 to 30,000. When the weight average molecular weight of the elastomer (a3) is 500 or more, there is a tendency that the curing properties of the resin composition and the dielectric characteristics of a cured material become more excellent. In addition, when the weight average molecular weight of the elastomer (a3) is 50,000 or less, on the occasion of forming an interlayer insulating layer, there is a tendency that the separation between the inorganic filler (a2) and the resin components is suppressed. As for the weight average molecular weight of the elastomer (a3), the measurement method of the weight average molecular weight of the polyimide compound (a1) described in the section of Examples can be applied.

In the case where the resin composition contains the elastomer (a3), its content is preferably 1 to 70% by mass, more preferably 5 to 50% by weight, and still more preferably 10 to 30% by mass relative to all of the resin components contained in the resin composition. By allowing the content of the elastomer (a3) to fall within the aforementioned range, there is a tendency that the dielectric tangent is low, on the occasion of forming a film, the handling properties are excellent, and on the occasion of forming an interlayer insulating layer, the separation between the inorganic filler (a2) and the resin components is suppressed.

<Other Components>

The resin composition for the layer A may contain a flame retardant, a curing accelerator, and so on, as the need arises.

When a flame retardant is contained in the resin composition, more excellent flame retardancy can be imparted.

Although the flame retardant is not particularly limited, examples thereof include a chlorine-based flame retardant, a bromine-based flame retardant, a phosphorus-based flame retardant, and a metal hydrate-based flame retardant. From the standpoint of compatibility with the environment, a phosphorus-based flame retardant and a metal hydrate-based flame retardant are preferred.

When the resin composition contains an appropriate curing accelerator, the curability of the resin composition is improved, whereby the dielectric characteristics, heat resistance, high elastic modulus, glass transition temperature, and so on can be more improved. Although the curing accelerator is not particularly limited, examples thereof include various imidazole compounds and derivatives thereof; various tertiary amine compounds; various quaternary ammonium compounds; and various phosphorus-based compounds, such as triphenylphosphine.

The resin composition may contain, in addition to those described above, additives, such as an antioxidant and a fluidity controlling agent.

(Resin Varnish)

On the occasion of producing the layer A, it is preferred to further contain an organic solvent in the resin composition for the layer A to render it in a state of resin varnish (hereinafter also referred to as "varnish for the layer A").

Examples of the organic solvent which is used for producing the varnish for the layer A include ketones, such as acetone, methyl ethyl ketone, methyl isobutyl ketone, and cyclohexanone; acetic acid esters, such as ethyl acetate, butyl acetate, cellosolve acetate, and carbitol acetate; (di) ethylene glycol monoalkyl ethers or propylene glycol monoalkyl ethers, such as cellosolve, butyl carbitol, and propylene glycol monomethyl ether; aromatic hydrocarbons, such as toluene and xylene; and amide-based solvents, such as dimethylformamide, dimethylacetamide, and N-methyl-2-pyrrolidone. These may be used alone, or may be used in combination of two or more thereof.

The content of the organic solvent is preferably 10 to 60 parts by mass, and more preferably 10 to 35 parts by mass based on 100 parts by mass of the whole of the varnish for the layer A.

By using the thus produced varnish for the layer A, the composite film of the present invention can be produced as mentioned above.

As for a cured material of the resin composition for the layer A, a molecular weight between crosslinking sites determined from an elastic shear modulus at Tg or higher is preferably 1,000 to 2,000. The elastic shear modulus is a value measured with a dynamic viscoelasticity apparatus.

The molecular weight between crosslinking sites determined from an elastic shear modulus at Tg or higher through measurement with a dynamic viscoelasticity apparatus is, for example, described in "Mechanical Properties of Polymers and Composites", published by Kagaku-Dojin Publishing Company, INC (author: L. E. Nielsen, translator: Shigeharu ONOGI), and the molecular weight between crosslinking sites is determined from the description in the text. That is, the molecular weight between crosslinking sites is one calculated by utilizing an empirical formula in which the following formula (1) is in good agreement with the experimental results.

$$\log G \approx 7.0 + 293 \rho / Mc \tag{1}$$

(G: elastic shear modulus, $\rho$: density of material, Mc: molecular weight between crosslinking sites)

In the present formula, "dyn" is used as the unit of the elastic shear modulus. As for G (elastic shear modulus) in the formula (1), in general, a storage elastic modulus E at Tg or higher as calculated from a dynamic viscoelasticity apparatus is determined from a transformation formula of the following formula (2).

$$E=2G(1+\sigma) \quad (2)$$

(σ: Poisson's ratio)

The dynamic viscoelasticity apparatus is one generally measuring dynamic viscoelasticity by applying sinusoidal wave vibration or composite wave vibration to a specimen in the elongation, compression, bending, or shear direction by a non-resonant forced vibration method. As an example of a commercially available apparatus, there can be mentioned Rheosol-E-4000, manufactured by UBM Co., Ltd. A method for the measurement is such that sinusoidal wave or composite wave vibration is applied to a specimen placed in a thermostatic chamber at set frequency and amplitude, and the resultant stress response can be detected by a detector to determine a storage elastic modulus or the like by calculation from a measurement operation formula.

As a result of extensive and intensive investigations made by the present inventors, it has been found that when the molecular weight between crosslinking sites of a cured material of the resin composition for the layer A falls within the aforementioned range, there is a tendency that the high frequency characteristics are more enhanced.

In the case where an inorganic filler as mentioned later is blended in the resin composition in the present embodiment, the molecular weight between crosslinking sites which can be measured from the cured material becomes apparently smaller than the value of molecular weight between crosslinking sites of the resin due to the elastic modulus of the inorganic filler. For this reason, it is preferred that the elastic modulus is measured in a state where the inorganic filler is removed, and the molecular weight between crosslinking sites is calculated. In the case where the inorganic filler cannot be removed, the elastic modulus is corrected using the following formula (3), and the molecular weight between crosslinking sites calculated using the aforementioned formula (1) and formula (2) can be applied as the molecular weight between crosslinking sites in the present invention. However, in the correction of elastic modulus using the formula (3), Pa is used as a unit of the elastic modulus, and the unit is corrected to "dyn" in the formula (1), and, with respect to the Poisson ratio in the formula (2) and specific gravity, respective values for the single resin must be used. When these values cannot be actually measured, a Poisson ratio of 0.5 and a specific gravity of 1.2 are applied to the formula to make a calculation.

$$Eb=Ea-(0.065\times Vf^2+0.023\times Vf+0.001)\times Vf\times Ef/8 \quad (3)$$

(Vf: volume percentage of inorganic filler, Ea: storage elastic modulus in a state where inorganic filler is blended, Eb: corrected storage modulu, Ef: elastic modulus of inorganic filler)

[Components of Layer B]

As the components of the layer B, there is enumerated a resin composition. The resin composition is not particularly limited so long as it may improve the adhesion to the conductor layer. However, for example, from the viewpoint that even if the surface roughness is small, the adhesion to plated copper is excellent, a resin composition containing a polyfunctional epoxy resin (b1) and a phenolic hydroxy group-containing polybutadiene-modified polyamide resin (b2) is preferred, and a resin composition further containing an active ester curing agent (b3) is more preferred. The respective components are hereunder described in detail.

<Polyfunctional Epoxy Resin (b1)>

Although the polyfunctional epoxy resin (b1) is not particularly limited so long as it is a resin having two or more epoxy groups, examples thereof include a bisphenol A type epoxy resin, a bisphenol F type epoxy resin, a bisphenol S type epoxy resin, a cresol novolak type epoxy resin, a phenol novolak type epoxy resin, a biphenyl type epoxy resin, a naphthol type epoxy resin, an anthracene type epoxy resin, a dicyclopentadiene type epoxy resin, a naphthalene type epoxy resin, an aralkyl novolak type epoxy resin, a fluorene type epoxy resin, and a xanthene type epoxy resin. From the viewpoint of adhesion to plated copper, an epoxy resin having a biphenyl structure is preferred, and a polyfunctional epoxy resin having a biphenyl structure or an aralkyl novolak type epoxy resin having a biphenyl structure is more preferred.

The polyfunctional epoxy resin (b1) may be used alone, or may be used in combination of two or more thereof.

Although an epoxy equivalent of the polyfunctional epoxy resin (b1) is not particularly limited, from the viewpoint of adhesion, it is preferably 150 to 450 g/mol, more preferably 200 to 400 g/mol, and still more preferably 250 to 350 g/mol.

Although the content of the polyfunctional epoxy resin (b1) in the resin composition for the layer B is not particularly limited, it is preferably 10 to 90% by mass, more preferably 20 to 80% by mass, and still more preferably 30 to 70% by mass relative to all of the resin components contained in the resin composition. When the content of the polyfunctional epoxy resin (b1) is 10% by mass or more, there is a tendency that more excellent adhesive strength to plated copper is obtained, whereas when it is 90% by mass or less, there is a tendency that a lower dielectric tangent is obtained.

<Phenolic Hydroxy Group-Containing Polybutadiene-Modified Polyamide Resin (b2)>

Although the component (b2) is not particularly limited so long as it is a phenolic hydroxy group-containing polybutadiene-modified polyamide resin, those having a structural unit derived from a diamine, a structural unit derived from a phenolic hydroxy group-containing dicarboxylic acid, a structural unit derived from a phenolic hydroxy group-free dicarboxylic acid, and a structural unit derived from a polybutadiene having a carboxy group at the both ends thereof are preferred. Specifically, those having a structural unit represented by the following general formula (i), a structural unit represented by the following general formula (ii), and a structural unit represented by the following general formula (iii) are preferably exemplified.

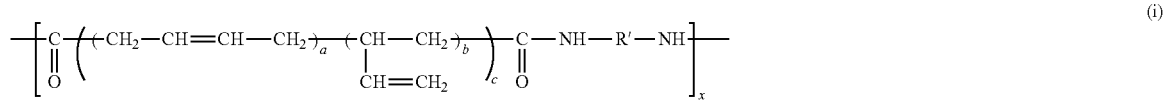

(i)

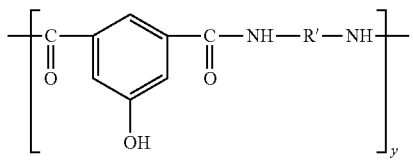
(ii)

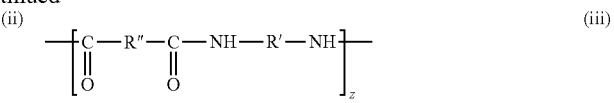
(iii)

In the general formulae (i) to (iii), a, b, c, x, y, and z are each an integer expressing an average degree of polymerization; a=2 to 10; b=0 to 3; c=3 to 30; when x=1, then (y+z)=2 to 300 ((y+z)/x); and when y=1, then z 20 (z/y).

In the general formulae (i) to (iii), R's each independently represent a divalent group derived from an aromatic diamine or an aliphatic diamine; and in the general formula (iii), R" represents a divalent group derived from an aromatic dicarboxylic acid, an aliphatic dicarboxylic acid, or an oligomer having a carboxy group at the both ends thereof.

The plural R's included in the general formulae (i) to (iii) may be the same as or different from each other. In addition, when z is an integer of 2 or more, the plural R"s may be the same as or different from each other.

In the general formulae (i) to (iii), specifically, it is preferred that R' is a divalent group derived from an aromatic diamine or an aliphatic diamine as mentioned later; and R" is a divalent group derived from an aromatic dicarboxylic acid, an aliphatic dicarboxylic acid, or an oligomer having a carboxy group at the both ends thereof as mentioned later.

Examples of the diamine which is used for forming the structural unit derived from a diamine in the component (b2) include an aromatic diamine and an aliphatic diamine.

Examples of the aromatic diamine include diaminobenzene, diaminotoluene, diaminophenol, diaminodimethylbenzene, diaminomesitylene, diaminonitrobenzene, diaminodiazobenzene, diaminonaphthalene, diaminobiphenyl, diaminodimethoxybiphenyl, diaminodiphenyl ether, diaminodimethyldiphenyl ether, methylenediamine, methylenebis(dimethylaniline), methylenebis(methoxyaniline), methylenebis(dimethoxyaniline), methylenebis(ethylaniline), methylenebis(diethylaniline), methylenebis(ethoxyaniline), methylenebis(diethoxyaniline), isopropylidenedianiline, diaminobenzophenone, diaminodimethylbenzophenone, diaminoanthraquinone, diaminodiphenyl thioether, diaminodimethyldiphenyl thioether, diaminodiphenylsulfone, diaminodiphenyl sulfoxide, and diaminofluorene.

Examples of the aliphatic diamine include ethylenediamine, propanediamine, hydroxypropanediamine, butanediamine, heptanediamine, hexanediamine, cyclopentanediamine, cyclohexanediamine, azapentanediamine, and triazaundecadiamine.

Examples of the phenolic hydroxy group-containing dicarboxylic acid which is used for forming the "structural unit derived from a phenolic hydroxy group-containing dicarboxylic acid" which the component (b2) has include hydroxyisophthalic acid, hydroxyphthalic acid, hydroxyterephthalic acid, dihydroxyisophthalic acid, and dihydroxyterephthalic acid.

Examples of the phenolic hydroxy group-free dicarboxylic acid which is used for forming the "structural unit derived from a phenolic hydroxy group-free dicarboxylic acid" which the component (b2) has include an aromatic dicarboxylic acid, an aliphatic dicarboxylic acid, and an oligomer having a carboxy group at the both ends thereof.

Examples of the aromatic dicarboxylic acid include phthalic acid, isophthalic acid, terephthalic acid, biphenyldicarboxylic acid, methylene dibenzoic acid, thiodibenzoic acid, carbonyldibenzoic acid, sulfonylbenzoic acid, and naphthalenedicarboxylic acid.

Examples of the aliphatic dicarboxylic acid include oxalic acid, malonic acid, methylmalonic acid, succinic acid, glutaric acid, adipic acid, maleic acid, fumaric acid, malic acid, tartaric acid, (meth)acryloyloxysuccinic acid, di(meth)acryloyloxysuccinic acid, (meth)acryloyloxymalic acid, (meth)acrylamidosuccinic acid, and (meth)acrylamidomalic acid.

Although a weight average molecular weight of the component (b2) is not particularly limited, for example, it is preferably 60,000 to 250,000, and more preferably 80,000 to 200,000. The weight average molecular weight of the component (b2) can be determined by the same method as in the weight average molecular weight of the polyimide compound (a1) as mentioned above.

Although an active hydroxy group equivalent of the component (b2) is not particularly limited, it is preferably 1,500 to 7,000 g/mol, more preferably 2,000 to 6,000 g/mol, and still more preferably 3,000 to 5,000 g/mol.

The component (b2) is, for example, synthesized by allowing a diamine, a phenolic hydroxy group-containing dicarboxylic acid, a phenolic hydroxy group-free dicarboxylic acid, and a polybutadiene having a carboxy group at the both ends thereof to react with each other in an organic solvent, such as dimethylacetamide, in the presence of, as a catalyst, a phosphorous acid ester and a pyridine derivative, thereby polycondensating the carboxy group and the amino group. As the respective compounds which can be used for the production, those mentioned above can be exemplified.

As for the polybutadiene having a carboxy group at the both ends thereof, which is used for the production of the component (b2), for example, its number average molecular weight is preferably 200 to 10,000, and an oligomer having a number average molecular weight of 500 to 5,000 is more preferred.

Although the content of the component (b2) in the resin composition for the layer B is not particularly limited, it is preferably 1 to 20% by mass, more preferably 2 to 15% by mass, and still more preferably 3 to 10% by mass relative to all of the resin components contained in the resin composition. When the content of the component (b2) is 1% by mass or more, the toughness of the resin composition can be enhanced, a minute roughened shape is obtained, and the adhesion to plated copper can be enhanced. In addition, when it is 20% by mass or less, the heat resistance is not deteriorated, and deterioration of the resistance to the chemical liquid at the time of a roughening step can be prevented from occurring. In addition, sufficient adhesion to the plated copper can be secured.

<Active Ester Curing Agent (b3)>

The active ester curing agent (b3) refers to one having one or more ester groups in one molecule and having a curing action of the epoxy resin.

Although the active ester curing agent (b3) is not particularly limited, examples thereof include ester compounds obtained from an aliphatic or aromatic carboxylic acid and an aliphatic or aromatic hydroxy compound.

Among them, as for an ester compound obtained from an aliphatic carboxylic acid, an aliphatic hydroxy compound, or the like, in view of the fact that it includes an aliphatic chain, there is a tendency that solubility in an organic solvent and compatibility with the epoxy resin can be enhanced.

As for an ester compound obtained from an aromatic carboxylic acid, an aromatic hydroxy compound, or the like, in view of the fact that it has an aromatic ring, there is a tendency that the heat resistance is enhanced.

Examples of the active ester curing agent (b3) include a phenol ester compound, a thiophenol ester compound, an N-hydroxyamine ester compound, and an esterified compound of a heterocyclic hydroxy compound.

More specifically, examples thereof include aromatic esters obtained through a condensation reaction between an aromatic carboxylic acid and a phenolic hydroxy group. Aromatic esters obtained through a condensation reaction between an aromatic carboxylic acid and a phenolic hydroxy group by using, as a raw material, a mixture of an aromatic carboxylic acid component selected from a material obtained by substituting 2 to 4 hydrogen atoms of an aromatic ring of benzene, naphthalene, biphenyl, diphenylpropane, diphenylmethane, diphenyl ether, diphenyl sulfonic acid, or the like with a carboxy group, a monovalent phenol obtained by substituting one hydrogen atom of the aforementioned aromatic ring with a hydroxy group, and a polyhydric phenol obtained by substituting 2 to 4 hydrogen atoms of an aromatic ring with a hydroxy group, and the like are preferred. That is, an aromatic ester having the aforementioned structural unit derived from an aromatic carboxylic acid component, the aforementioned structural unit derived from a monovalent phenol, and the aforementioned structural unit derived from a polyhydric phenol is preferred.

The active ester curing agent (b3) may be used alone, or may be used in combination of two or more thereof.

Although an ester equivalent of the active ester curing agent (b3) is not particularly limited, it is preferably 150 to 400 g/mol, more preferably 170 to 300 g/mol, and still more preferably 200 to 250 g/mol.

An equivalent ratio ((ester group)/(epoxy group)) of an ester group of the active ester curing agent (b3) to an epoxy group of the polyfunctional epoxy resin (b1) in the resin composition is preferably 0.05 to 1.5, more preferably 0.1 to 1.3, and still more preferably 0.2 to 1.0. When the equivalent ratio ((ester group)/(epoxy group)) falls within the aforementioned range, not only the adhesive strength to plated copper is more enhanced, but also a lower dielectric tangent and a smooth surface are obtained, and hence, such is suitable from the viewpoint of forming a fine wiring.

<Phosphorus-based Curing Accelerator (b4)>

It is preferred that the resin composition for the layer B further contains a phosphorus-based curing accelerator (b4).

The phosphorus-based curing accelerator (b4) can be used without particular limitations so long as it is a curing accelerator containing a phosphorus atom and capable of accelerating the reaction between the polyfunctional epoxy resin (b1) and the active ester curing agent (b3).

When the resin composition contains the phosphorus-based curing accelerator (b4), the curing reaction can be much more sufficiently advanced. As for this reason, it may be assumed that by using the phosphorus-based curing accelerator (b4), electron-withdrawing properties of the carbonyl group in the active ester curing agent (b3) can be enhanced, whereby the reaction between the active ester curing agent (b3) and the polyfunctional epoxy resin (b1) is accelerated.

In this way, in view of the fact that the resin composition contains the phosphorus-based curing accelerator (b4), it may be considered that as compared with the case of using other curing accelerator, the curing reaction between the polyfunctional epoxy resin (b1) and the active ester curing agent (b3) is much more sufficiently advanced, so that when combined with the first resin layer, a low dielectric tangent is obtained.

Examples of the phosphorus-based curing accelerator (b4) include organic phosphines, such as triphenylphosphine, a diphenyl(alkylphenyl)phosphine, a tris(alkylphenyl)phosphine, a tris(alkoxyphenyl)phosphine, a tris(alkylalkoxyphenyl)phosphine, a tris(dialkylphenyl)phosphine, a tris(trialkylphenyl)phosphine, a tris(tetraalkylphenyl)phosphine, a tris(dialkoxyphenyl)phosphine, a tris(trialkoxyphenyl)phosphine, a tris(tetraalkoxyphenyl)phosphine, a trialkylphosphine, a dialkylarylphosphine, and an alkyldiarylphosphine; complexes between an organic phosphine and an organic boron compound; and adducts between a tertiary phosphine and a quinone. From the viewpoint that the curing reaction is more sufficiently advanced, whereby high adhesion to plated copper can be exhibited, adducts between a tertiary phosphine and a quinone are preferred.

Although the tertiary phosphine is not particularly limited, examples thereof include tri-n-butylphosphine, dibutylphenylphosphine, butyldiphenylphosphine, ethyldiphenylphosphine, triphenylphosphine, tris(4-methylphenyl)phosphine, and tris(4-methoxyphenyl)phosphine. In addition, examples of the quinone include o-benzoquinone, p-benzoquinone, diphenoquinone, 1,4-naphthoquinone, and anthraquinone. From the standpoints of adhesion to plated copper and heat resistance as well as the matter that a smooth surface is obtained, an adduct between tri-n-butylphosphine and p-benzoquinone is more preferred.

Examples of a production method of an adduct between a tertiary phosphine and a quinone include a method in which the tertiary phosphine and the quinone serving as the raw materials are stirred and mixed in a solvent in which the both are soluble, to undergo an addition reaction, followed by isolation. In this case, as for a production condition, for example, it is preferred that the tertiary phosphine and the quinone are stirred in a solvent, such as a ketone, e.g., methyl isobutyl ketone, methyl ethyl ketone, and acetone, at a temperature ranging from 20 to 80° C. for 1 to 12 hours, to undergo an addition reaction.

The phosphorus-based curing accelerator (b4) may be used alone, or may be used in combination of two or more thereof. In addition, one or more curing accelerators other than the phosphorus-based curing accelerator (b4) may also be jointly used.

Although the content of the phosphorus-based curing accelerator (b4) in the resin composition for the layer B is not particularly limited, it is preferably 0.1 to 20% by mass, more preferably 0.2 to 15% by mass, and still more preferably 0.4 to 10% by mass relative to all of the resin components contained in the resin composition. When the content of the phosphorus-based curing accelerator (b4) is 0.1% by mass or more, the curing reaction can be sufficiently advanced, whereas when it is 20% by mass or less, homogeneity of the cured material can be kept.

<Filler (b5)>

The resin composition for the layer B may contain a filler (b5). Examples of the filler (b5) include an inorganic filler and an organic filler. Of these, an inorganic filler is preferred.

When the filler (b5) is contained, scattering of the resin on the occasion of subjecting the layer B to laser processing can be more reduced.

Although the inorganic filler is not particularly limited, for example, the same materials exemplified for the inorganic filler (a2) can be used.

From the viewpoint of forming a fine wiring on the layer B, it is preferred that a particle diameter of the inorganic filler is small. From the same viewpoint, a specific surface area of the inorganic filler is preferably 20 m$^2$/g or more, and more preferably 50 m$^2$/g or more. Although an upper limit of the specific surface area is not particularly limited, from the viewpoint of easiness of availability, it is preferably 500 m$^2$/g or less, and more preferably 200 m$^2$/g or less.

The specific surface area can be determined by the BET method based on physical adsorption of an inactive gas at low temperature and low humidity. Specifically, a molecule whose absorption occupied area is already-known is adsorbed on the surface of a powder particle at a liquid nitrogen temperature, and the specific surface area of the powder particle can be determined from the adsorption amount.

The content of the inorganic filler in the resin composition for the layer B is preferably 1 to 30% by mass, more preferably 2 to 25% by mass, still more preferably 3 to 20% by mass, and especially preferably 5 to 20% by mass relative to the solid content of the resin composition. When the content of the inorganic filler is 1% by mass or more, there is a tendency that more excellent laser processability is obtained, whereas when it is 30% by mass or less, there is a tendency that the adhesion between the layer B and the conductor layer is more improved.

Although the organic filler is not particularly limited, examples thereof include a copolymer of acrylonitrile and butadiene, such as a crosslinked NBR particle obtained through copolymerization of acrylonitrile and butadiene, and a copolymer of acrylonitrile, butadiene, and a carboxylic acid, such as acrylic acid; and a so-called core-shell rubber particle in which a core is formed of polybutadiene, NBR, a silicone rubber, etc. and a shell is formed of an acrylic acid derivative. When the organic filler is contained, there is a tendency that the elongation of the resin layer is more improved.

<Other Components>

The resin composition for the layer B can contain, in addition to the aforementioned respective components, other thermosetting resin, a thermoplastic resin, and additives, such as a flame retardant, an antioxidant, a fluidity controlling agent, and a curing accelerator, as the need arises so long as the effects of the present invention are not impaired.

With respect to the composite film of the present invention, a cured material thereof preferably has a dielectric tangent at 5 GHz of 0.010 or less, more preferably 0.008 or less, still more preferably 0.006 or less, yet still more preferably 0.005 or less, and especially preferably 0.0040 or less. Although a lower limit value thereof is not particularly limited, it may be 0.002 or more, and it may also be 0.0030 or more. The dielectric tangent can be determined by the method described in the section of Examples.

Next, though a preferred embodiment specialized for solving the problem [II] is explained, it should be construed that this embodiment is not specifically limited. However, in the embodiment for solving the problem [I], this embodiment may also be taken as a more preferred embodiment when taking into consideration solution of the problem [II].

[Insulating Resin Material]

The insulating resin material of the present embodiment capable of solving the problem [II] is an insulating resin material containing a thermosetting resin (A), an inorganic filler (B), and an elastomer (C), the insulating resin material containing 0.5 to 5% by mass of a high-boiling solvent (X) relative to a solid content of the insulating resin material. From the viewpoint of solving the problem [II], an embodiment in which the layer A (first resin layer) of the composite film of the present invention contains the foregoing insulating material is more preferred.

<Thermosetting Resin (A)>

Although the thermosetting resin (A) is not particularly limited, examples thereof include an epoxy resin, a cyanate resin, and a maleimide resin. Of these, a maleimide resin is preferred, and from the viewpoint of low thermal expansion properties, the aforementioned polyimide compound (a1) is more preferred. With respect to all conditions, the same explanation as in the aforementioned polyimide compound (a1) is applicable.

<Inorganic Filler (B)>

As the inorganic filler (B), the same material as in the aforementioned inorganic filler (a2) can be used, and with respect to all conditions, the same explanation as in the aforementioned inorganic filler (a2) is applicable. Although the content of the inorganic filler (B) in the insulating resin material can be properly selected according to the required characteristics and functions, it may be 40 to 90% by mass, may be 50 to 85% by mass, may be 60 to 85% by mass, and may be 65 to 80% by mass in the solid content of the insulating resin composition. When the content of the inorganic filler (B) is 40% by mass or more, there is a tendency that the low coefficient of thermal expansion and the high elastic modulus can be made compatible with each other, and that the amount of warpage at the time of mounting can be reduced. In addition, when it is 90% or less, there is a tendency that the minimum melt viscosity of the insulating resin material can be kept excellent.

In the present specification, the solid content of the insulating resin material means a residue resulting from removal of the volatile component from the components constituting the insulating resin material.

<Elastomer (C)>

As the elastomer (C), the same material as in the aforementioned elastomer (a3) can be used, and with respect to all conditions, the same explanation as in the aforementioned elastomer (a3) is applicable.

Although the total content of the thermosetting resin (A) and the elastomer (C) in the insulating resin material of the present embodiment is not particularly limited, it is preferably 5% by mass or more, more preferably 10% by mass or more, and still more preferably 15% by mass or more relative to the solid content of the insulating resin material. Although an upper limit of the content is not particularly limited, it may be 50% by mass or less, and may be 40% by mass or less.

<High-Boiling Solvent (X)>

The insulating resin material of the present embodiment contains a high-boiling solvent (X). In view of the fact that the insulating resin material of the present embodiment contains the high-boiling solvent (X), there is a tendency that the wiring embedding properties are excellent.

The boiling point of the solvent in the present embodiment means a boiling point at 1 atm (normal boiling point).

The high-boiling solvent (X) is not particularly limited, and examples thereof include an alcohol, a ketone, an aromatic hydrocarbon, an ester, and a nitrogen-containing material. Of these, a nitrogen-containing material is preferred from the viewpoint of handling properties when formed into a film.

Specific example of the high-boiling solvent (X) include N-methylpyrrolidone, N,N-dimethylacetamide, N,N-dimethylformamide, cyclohexanone, γ-butyrolactone, mesitylene, ethoxyethyl acetate, and butoxyethyl acetate. These may be used alone, or may be used in combination of two or more thereof. Of these, from the viewpoint of handling properties when formed into a film, N-methylpyrrolidone, N,N-dimethylacetamide, and cyclohexanone are preferred, and N-methylpyrrolidone and N,N-dimethylacetamide are more preferred.

From the viewpoint of handling properties when formed into a film, the boiling point of the high-boiling solvent (X) is preferably 150° C. or higher, more preferably 150 to 250° C., still more preferably 155 to 230° C., and especially preferably 155 to 210° C.

The content of the high-boiling solvent (X) in the insulating resin material of the present embodiment is 0.5 to 5% by mass, more preferably 0.6 to 5% by mass, and still more preferably 0.7 to 5% by mass. When the content of the high-boiling solvent (X) is 0.5% by mass or more, not only a low minimum metal viscosity is obtained, but also the change of minimum melt viscosity with time can be suppressed, whereas when it is 5% by mass or less, the release properties from the support become more excellent, and the handling properties become excellent. The content of the high-boiling solvent (X) in the insulating resin material of the present embodiment can be measured in such a manner that on the occasion of heating the insulating resin material under a condition at 180° C. for 30 minutes, the weights before and after heating are measured, and the amount of change is calculated, and specifically, it can be measured by the method described in the section of Examples.

<Other Components>

The insulating resin material of the present embodiment may contain a flame retardant, a curing accelerator, and so on, as the need arises.

When a flame retardant is contained in the insulating resin material of the present embodiment, more excellent flame retardancy can be imparted. Although the flame retardant is not particularly limited, examples thereof include a chlorine-based flame retardant, a bromine-based flame retardant, a phosphorus-based flame retardant, and a metal hydrate-based flame retardant. From the standpoint of compatibility with the environment, a phosphorus-based flame retardant or a metal hydrate-based flame retardant is preferred.

When the insulating resin material of the present embodiment contains an appropriate curing accelerator, the curability of the insulating resin material is improved, whereby the dielectric characteristics, heat resistance, high elastic modulus, glass transition temperature, and so on can be more improved. The curing accelerator is not particularly limited, and examples thereof include various imidazole compounds and derivatives thereof; various tertiary amine compounds; various quaternary ammonium compounds; and various phosphorus-based compounds, such as triphenylphosphine.

The insulating resin material of the present embodiment may contain, in addition to those mentioned above, additives, such as an antioxidant and a fluidity controlling agent.

[Resin Film for Interlayer Insulation]

The resin film for interlayer insulation of the present embodiment is one including the insulating resin material of the present embodiment.

The resin film for interlayer insulation of the present embodiment may also be one in which a support is provided on either one surface thereof.

Examples of the support include films of polyolefins, such as polyethylene, polypropylene, and polyvinyl chloride; films of polyesters, such as polyethylene terephthalate (hereinafter also referred to as "PET") and polyethylene naphthalate; and various plastic films, such as a polycarbonate film and a polyimide film. In addition, a metal foil, such as a copper foil and an aluminum foil, a release paper, and so on may also be used. The support and a protective film as mentioned later may be ones having been subjected to a surface treatment, such as a matting treatment and a corona treatment. In addition, the support and a protective film as mentioned later may also be ones having been subjected to a release treatment with a silicone resin-based release agent, an alkyd resin-based release agent, a fluorine resin-based release agent, or the like.

Although the thickness of the support is not particularly limited, it is preferably 10 to 150 μm, and more preferably 25 to 50 μm.

Although the resin film for interlayer insulation of the present embodiment is not particularly limited with respect to applications, it can be used over a wide range of applications in which an interlayer insulating layer is considered to be needed, inclusive of an insulating resin sheet, such as an adhesive film and a prepreg, a circuit board, a solder resist, an underfill material, a die bonding material, a semiconductor sealing material, a hole plugging resin, and a module-embedding resin. Among these, it can be suitably used for forming an interlayer insulating layer in the production of a printed wiring board.

Next, a production method of the resin film for interlayer insulation of the present embodiment is explained.

<Production Method of Resin Film for Interlayer Insulation>

The resin film for interlayer insulation of the present embodiment may be utilized as the aforementioned layer A and can be, for example, produced in the following manner.

On the occasion of producing the resin film for interlayer insulation, first of all, the thermosetting resin (A), the inorganic filler (B), the elastomer (C), and the high-boiling solvent (X), and optionally used other components are mixed to produce a first thermosetting resin composition. At this time, it is preferred to render the first thermosetting resin composition in a state of a resin varnish having been dissolved or dispersed in an organic solvent (hereinafter also referred to as "varnish for resin film for interlayer insulation").

From the viewpoint of productivity, the organic solvent which is used for the production of the varnish for resin film for interlayer insulation is preferably a solvent other than the high-boiling solvent (X) (hereinafter also referred to as "solvent (Y)"). That is, it is preferred that the varnish for resin film for interlayer insulation contains the high-boiling solvent (X) and the solvent (Y).

From the same viewpoint, the boiling point of the solvent (Y) is preferably lower than 150° C., more preferably 60 to 145° C., still more preferably 70 to 130° C., and yet still more preferably 110 to 130° C.

Examples of the solvent (Y) include ketones, such as acetone, methyl ethyl ketone, and methyl isobutyl ketone; acetic acid esters, such as ethyl acetate and butyl acetate; (di)ethylene glycol monoalkyl ethers or propylene glycol monoalkyl ethers, such as cellosolve, butyl carbitol, and propylene glycol monomethyl ether; and aromatic hydrocarbons, such as toluene and xylene. These solvents may be used alone, or may be used in combination of two or more thereof.

The content of the high-boiling solvent (X) in the total amount (namely, all of the solvents) of the high-boiling solvent (X) and the solvent (Y) contained in the varnish for resin film for interlayer insulation is preferably 1 to 15% by mass, more preferably 1 to 10% by mass, and still more preferably 1 to 5% by mass.

The total content (namely, the content of all of the solvents) of the high-boiling solvent (X) and the solvent (Y) contained in the varnish for resin film for interlayer insulation is preferably 10 to 90% by mass, more preferably 20 to 70% by mass, still more preferably 20 to 60% by mass, and especially preferably 20 to 50% by mass.

The resin film for interlayer insulation is obtained by coating the thus produced varnish for resin film for interlayer insulation on the aforementioned support, followed by heating for drying.

As for a method of coating the varnish for resin film for interlayer insulation on the support, for example, a coating device, such as a comma coater, a bar coater, a kiss coater, a roll coater, a gravure coater, and a die coater, can be used. It is preferred that a coating device is properly selected according to the film thickness.

A drying condition after coating is not particularly limited, and it may be properly determined according to the kind of the solvent. For example, a drying temperature is preferably 50 to 150° C., and more preferably 100 to 145° C., and a drying time can be, for example, set to 2 to 10 minutes.

In the case of using the resin film for interlayer insulation of the present embodiment when disposed on a conductor layer, from the viewpoint of embedding the conductor layer of a circuit board, its thickness is preferably the thickness of the conductor layer of the circuit board or more. Specifically, since the thickness of the conductor layer which the circuit board has is typically in a range of 5 to 70 µm, the thickness of the resin film for interlayer insulation is preferably 5 to 100 µm.

A protective film may be provided on a surface of the resin film for interlayer insulation formed on the support, on the side opposite to the support. Although the thickness of the protective film is not particularly limited, for example, it is 1 to 40 µm. By laminating the protective film, attachment of a dust, etc. and scratch on the surface of the resin film for interlayer insulation can be prevented from occurring. The resin film for interlayer insulation can be stored upon being wound up in a roll state.

[Composite Film]

The composite film of the present embodiment is a composite film having a layer containing the insulating resin material of the present embodiment, and preferably a composite film containing a first resin layer (corresponding to the aforementioned layer A) containing the insulating resin material of the present embodiment and a second resin layer (corresponding to the aforementioned layer B). With respect to the details of the composite film, the same explanations as in the aforementioned composite film and its production method are applicable, except for the matter that the insulating resin material of the present embodiment is contained in the layer A that is the first resin layer.

From the viewpoints of wiring embedding properties and handling properties, the minimum melt viscosity of the composite viscosity of the present embodiment is preferably 5,000 Pa·s or less, more preferably 100 to 2,000 Pa·s, still more preferably 150 to 1,000 Pa·s, and especially preferably 200 to 500 Pa·s. The minimum melt viscosity of the composite film can be measured by the method described in the section of Examples.

Next, though a preferred embodiment specialized for solving the problem [III] is explained, it should be construed that this embodiment is not specifically limited. However, in the embodiment for solving the problem [I], this embodiment may also be taken as a more preferred embodiment when taking into consideration solution of the problem [III].

[Thermosetting Resin Composition]

The thermosetting resin composition capable of solving the problem [III] is a thermosetting resin composition containing a thermosetting resin (A), an inorganic filler (B), and a conjugated diene-based elastomer (C'), wherein a total amount of a 1,4-trans body and a 1,4-cis body is 90% or more on a basis of the whole amount of entire carbon-carbon double bonds of the conjugated diene-based elastomer (C'). From the viewpoint of solving the problem [III], it is preferred that the layer A (first resin layer) of the composite film of the present invention contains the foregoing thermosetting resin composition.

<Thermosetting Resin (A) and Inorganic Filler (B)>

As for the thermosetting resin (A) and the inorganic filler (B), the same explanations as in the thermosetting resin (A) and the inorganic filler (B) which the aforementioned insulating resin material contains are applicable.

<Conjugated Diene-Based Elastomer (C')>

Although the elastomer (C') is not particularly limited so long as it includes 90% or more of the 1,4-trans body and the 1,4-cis body, examples thereof include a polybutadiene-based elastomer. As the component (C'), one having a reactive functional group at a molecular end or in a molecular chain can be used. As for the reactive functional group, at least one selected from the group consisting of a maleic anhydride group, an epoxy group, a hydroxy group, a carboxy group, an amino group, an amide group, an isocyanate group, an acryl group, a methacryl group, and a vinyl group is preferred. When the elastomer has such a reactive functional group at a molecular end or in a molecular chain, there is a tendency that compatibility with the resin is improved, and that on the occasion of forming an interlayer insulating layer, separation between the component (B) and the resin components is suppressed.

The polybutadiene-based elastomer is an elastomer including a polybutadiene compound as a monomer unit, and as for the polybutadiene unit in the elastomer, a unit (I) (1,4-trans body) and a unit (II) (1,4-cis body), each of which is a main chain, and a unit (III) (1,2-butadiene elemental body having a 1,2-vinyl group) are present. In the present embodiment, a total amount of the unit (I) and the unit (II) is 90% or more among the entire carbon-carbon double bonds of the elastomer.

In the polybutadiene-based elastomer, the total amount of the 1,4-trans body and the 1,4-cis body is preferably 93% or more, more preferably 96% or more, and still more preferably 98% or more on a basis of the whole amount of entire carbon-carbon double bonds of the conjugated diene-based elastomer (C'). In the polybutadiene-based elastomer, as the total amount of the unit (I) and the unit (II) is larger, a molecular skeleton of the component (C') becomes symmetric, and the dielectric characteristics are excellent.

(I)

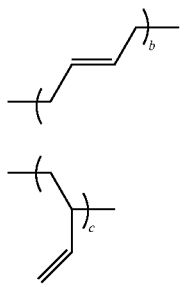

(II)

(III)

As the polybutadiene-based elastomer, from the viewpoints that the compatibility with the resin is improved, and that on the occasion of forming an interlayer insulating layer, the separation between the component (B) and the resin components is suppressed, one having a reactive functional group is preferred, and a polybutadiene-based elastomer modified with an acid anhydride is especially preferred. Although the acid anhydride is not limited, examples thereof include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride, and methyltetrahydrophthalic anhydride. The acid anhydride is preferably any of phthalic anhydride, maleic anhydride, trimellitic anhydride, pyromellitic anhydride, hexahydrophthalic anhydride, or tetrahydrophthalic anhydride, and a polybutadiene modified with maleic anhydride is more preferred.

In the case where the component (C') is modified with an acid anhydride, the number of an acid anhydride-derived group contained in one molecule of the component (C') (hereinafter also referred to as "acid anhydride group") is preferably 1 to 10, more preferably 1 to 6, and still more preferably 2 to 5. When the number of the acid anhydride group is 1 or more in one molecule, there is a tendency that on the occasion of forming an interlayer insulating layer, the separation between the inorganic filler and the resin components is more suppressed. In addition, when the number of the acid anhydride group is 10 or less in one molecule, there is a tendency that the dielectric tangent of the thermosetting resin composition becomes lower. In the case where the component (C') is modified with maleic anhydride, from the same viewpoint as mentioned above, the number of a maleic anhydride-derived group contained in one molecule of the component (C') (hereinafter also referred to as "maleic anhydride group") is preferably 1 to 10, more preferably 1 to 6, still more preferably 2 to 5, and especially preferably 3 to 5.

Specifically, examples of the polybutadiene-based elastomer include POLYVEST 110, POLYVEST 130, POLYVEST MA75, and POLYVEST EP MA120 (trade names, manufactured by Evonik).

A weight average molecular weight of the component (C') is preferably 500 to 25,000, more preferably 1,000 to 20,000, and still more preferably 1,000 to 10,000. In the case where the weight average molecular weight of the component (C') is 500 or more, there is a tendency that the curing properties of the resulting thermosetting resin composition and the dielectric characteristics when formed into a cured material become more excellent. In addition, when the weight average molecular weight of the component (C') is 25,000 or less, on the occasion of forming an interlayer insulating layer, there is a tendency that the separation between the component (B) and the resin components is suppressed, and that the gloss unevenness of the board is suppressed. The measurement method of the weight average molecular weight of the component (C') is the same as the measurement method of the weight average molecular weight of the component (A).

Although the blending amount of the component (C') component is not particularly limited, it is preferably 1 to 30% by mass, more preferably 2 to 20% by mass, and still more preferably 3 to 10% by mass in the total mass of all of the resin components contained in the thermosetting resin composition of the present embodiment. By allowing the content of the component (C') to fall within the aforementioned range, there is a tendency that the dielectric tangent is low, that on the occasion of forming a film, the handling properties are excellent, and that the separation of the resin of the resulting interlayer insulation layer is not generated.

Although the total content of the component (A) and the component (C') in the resin composition of the present embodiment is not particularly limited, it is preferably 5% by mass or more, more preferably 10% by mass or more, and still more preferably 15% by mass or more in the total mass of all of the resin components contained in the thermosetting resin composition of the present embodiment. Although an upper limit of the content is not particularly limited, it may be 15% by mass or more.

<Other Components>

With respect to other components, the same explanation as in the aforementioned other components which the insulating resin material contains is applicable.

[Resin Film for Interlayer Insulation]

The same explanation is applicable, except that in the aforementioned resin film for interlayer insulation, the thermosetting resin composition capable of solving the problem [III] is used in place of the insulating resin material capable of solving the problem [II].

<Production Method of Resin Film for Interlayer Insulation>

The resin film for interlayer insulation of the present embodiment can be, for example, produced in the following manner.

On the occasion of producing the resin film for interlayer insulation, first of all, it is preferred that the component (A), the component (B), and the component (C'), and optionally used other components are dissolved or dispersed in an organic solvent to prepare a resin varnish (hereinafter also referred to as "varnish for resin film for interlayer insulation").

Examples of the organic solvent which is used for producing the varnish for resin film include ketones, such as acetone, methyl ethyl ketone, methyl isobutyl ketone, and cyclohexanone; acetic acid esters, such as ethyl acetate, butyl acetate, cellosolve acetate, propylene glycol monomethyl ether, and carbitol acetate; carbitols, such as cellosolve and butyl carbitol; aromatic hydrocarbons, such as toluene and xylene; and amide-based solvents, such as dimethylformamide, dimethylacetamide, and N-methylpyrrolidone. These organic solvents may be used alone, or may be used in combination of two or more thereof.

The blending amount of the organic solvent is preferably 10 to 60 parts by mass, and more preferably 10 to 35 parts by mass based on 100 parts by mass of the total mass of the varnish for resin film.

The resin film is obtained by coating the thus produced varnish for resin film on the aforementioned support, followed by heating for drying.

As for a method of coating the varnish for resin film on the support, for example, a coating device, such as a comma coater, a bar coater, a kiss coater, a roll coater, a gravure coater, and a die coater, can be used. It is preferred that such a coating device is properly selected according to the film thickness.

Although a drying condition after coating is not particularly limited, for example, in the case of a varnish for resin film for interlayer insulation containing 30 to 60% by mass of an organic solvent, the resin film for interlayer insulation can be suitably formed by drying at 50 to 150° C. for approximately 1 to 10 minutes. The varnish is dried in such a manner that the content of a volatile component (mainly the organic solvent) in the resin film for interlayer insulation after drying is preferably 10% by mass or less, and more preferably 6% by mass or less.

In the case of using the resin film for interlayer insulation of the present embodiment when disposed on a conductor layer, from the viewpoint of embedding the conductor layer of a circuit board, its thickness is preferably the thickness of the conductor layer of the circuit board or more. Specifically, since the thickness of the conductor layer which the circuit board has is typically in a range of 5 to 70 μm, the thickness of the resin film for interlayer insulation is preferably 5 to 100 μm.

A protective film may be provided on a surface of the resin film for interlayer insulation formed on the support, on the side opposite to the support. Although the thickness of the protective film is not particularly limited, for example, it is 1 to 40 μm. By laminating the protective film, attachment of a dust, etc. and scratch on the surface of the resin film for interlayer insulation can be prevented from occurring. The resin film can be stored upon being wound up in a roll state.

[Composite Film]

The composite film of the present embodiment is a composite film having a layer including the thermosetting resin composition of the present embodiment, and preferably a composite film including a first resin layer (corresponding to the aforementioned layer A) including the thermosetting resin composition of the present embodiment and a second resin layer (corresponding to the aforementioned layer B). With respect to the details of the composite film, the same explanations as in the aforementioned composite film and its production method are applicable, except for the matter that the thermosetting resin composition of the present embodiment is contained in the layer A that is the first resin layer.

The following printed wiring board and production method of same are explanations which are common to all of the aforementioned problems [I] to [III].

[Printed Wiring Board and Production Method of Same]

The printed wiring board of the present invention contains a cured material of the composite film of the present invention as mentioned above. In other words, the printed wiring board of the present invention has interlayer insulating layers, and at least one of the interlayer insulating layers includes the aforementioned resin composition, the aforementioned thermosetting resin composition, or the aforementioned insulating resin material.

A method of producing a multi-layered printed wiring board by laminating the composite film of the present invention on a circuit board is hereunder explained.

The method of producing a multi-layered printed wiring board of the present invention includes the following step (1). In more detail, the method of producing a multi-layered printed wiring board of the present invention includes the following steps (1) to (5), and after the step (1), the step (2), or the step (3), the support may be exfoliated or removed.

Step (1): A step of laminating the composite resin of the present invention on one or both surfaces of a circuit board Step (2): A step of curing the composite film to form an interlayer insulating layer Step (3): A step of boring the circuit board having the interlayer insulating layer formed thereon Step (4): A step of subjecting the surface of the interlayer insulating layer to a roughening treatment Step (5): A step of plating the surface of the roughened interlayer insulating layer <Step (1)>

The step (1) is a step of laminating the composite film of the present invention on one or both surfaces of a circuit board. Examples of an apparatus for laminating the composite film include a vacuum laminator, such as a vacuum applicator, manufactured by Nichigo-Morton Co., Ltd.

In the lamination, in the case where the composite film has a protective film, after removing the protective film, the composite film is subjected to pressure bonding to the circuit board while applying a pressure and/or heating.

In the case of using the composite film, the layer A is disposed such that it is opposed to the surface on which the circuit of the circuit board is formed.

As for a condition of the lamination, the composite film and the circuit board may be preheated as the need arises and laminated at a pressure bonding temperature (laminating temperature) of 60 to 140° C. and a pressure bonding pressure of 0.1 to 1.1 MPa ($9.8 \times 10^4$ to $107.9 \times 10^4$ N/m$^2$) under reduced pressure of 20 mmHg (26.7 hPa) or less in terms of an air pressure. In addition, the method of lamination may be either a batch mode or a continuous mode with a roll.

Although the board typically has a difference in level due to a circuit or a component, after laminating the composite film of the present invention on the board, the foregoing difference in level can be sufficiently filled by the layer A of the composite film. From the viewpoint that the degree of filling becomes sufficient, the lamination temperature is especially preferably 70 to 130° C.

<Step (2)>

The step (2) is a step of curing the composite film to form an interlayer insulating layer. The curing may be either thermal curing or curing with an active energy ray. Although a condition of thermal curing is not particularly limited, for example, it can be selected within a range at 170 to 220° C. for 20 to 80 minutes. The active energy ray is the same as that mentioned above.

After thermally curing the composite film, the support may be exfoliated.

<Step (3)>

The step (3) is a step of boring the circuit board having the interlayer insulating layer formed thereon. In the present step, the interlayer insulating layer and the circuit board are bored by a method using a drill, a laser, a plasma, or a combination thereof, or the like, thereby forming a via hole, a through-hole, or the like. As the laser, a carbon dioxide gas laser, a YAG laser, a UV laser, an excimer laser, and so on are generally used.

<Step (4)>

The step (4) is a step of subjecting the surface of the interlayer insulating layer to a roughening treatment. In the present step, in the case where a via hole, a through-hole, or the like is formed at the same time of subjecting the surface of the interlayer insulating layer formed in the step (2) with an oxidizing agent, the removal of "smear" generated on the occasion of forming such a hole or the like can also be performed.

Although the oxidizing agent is not particularly limited, examples thereof include permanganates (e.g., potassium permanganate and sodium permanganate), bichromates, ozone, hydrogen peroxide, sulfuric acid, and nitric acid. Among them, roughening and removal of smear may be performed using an alkaline permanganate solution (for example, a potassium permanganate or sodium permanganate solution) that is an oxidizing agent which is widely used for roughening of an interlayer insulating layer in the production of a multi-layered printed wiring board by the build-up process.

<Step (5)>

The step (5) is a step of plating the surface of the roughened interlayer insulating layer. The layer B of the composite film is a layer capable of being adapted for a semi-additive method. For that reason, in the present step, a semi-additive method in which a power feeding layer is formed on the surface of the interlayer insulating layer by means of electroless plating, a plated resist with a reverse pattern to the conductor layer is subsequently formed, and a conductor layer (circuit) is formed by means of electroplating can be adopted.

After forming the conductor layer, for example, the resultant is subjected to an annealing treatment at 150 to 200° C. for 20 to 120 minutes, whereby the adhesive strength between the interlayer insulating layer and the conductor layer can be improved and stabilized.

A step of roughening the surface of the thus prepared conductor layer may be further included. The roughening of the surface of the conductor layer has an effect for enhancing the adhesion to a resin which comes into contact with the conductor layer. Although a treating agent for roughening the conductor layer is not particularly limited, examples thereof include MECetchBOND CZ-8100, MECetchBOND CZ-8101, and MECetchBOND CZ-5480 (all of which are a trade name, manufactured by MEC Co., Ltd.), all of which are an organic acid-based microetching agent.

Among the foregoing production methods, according to the characteristic features of the present invention, the following method of producing a printed wiring board is exemplified as an example of the preferred embodiments.

A method of producing a printed wiring board, including
a step of using the composite film and sticking the side of the layer A of the composite film onto a board having a difference in level on a surface thereof due to a circuit or a component, to fill the difference in level;
a step of curing the layer A and the layer B of the composite film; and
a step of forming a circuit on a surface on the side of the layer B of the composite film by a semi-additive method.

The composite film and the printed wiring board of the present invention can be especially suitably used for electronic devices dealing with high frequency signals of 1 GHz or more, and in particular, can be suitably used for electronic devices dealing with high frequency signals of 5 GHz or more, high frequency signals of 10 GHz or more, or high frequency signals of 30 GHz or more. Namely, the composite film of the present invention is useful as a composite film for electronic device using high frequency signals.

It should be construed that the present invention is not limited to the aforementioned embodiments. The aforementioned embodiments are examples, and any embodiments having configurations and effects substantially similar to technical concepts described in the claims of the present invention are also included within the technical scope of the present invention.

EXAMPLES

The present invention is more specifically described by reference to the following Examples, but it should be construed that the present invention is by no means limited to these Examples.

First of all, Examples regarding the embodiment capable of solving the problem [I] of the present invention are described.

Production Method 1[I] (Production of Polyimide Compound (a1))

In a glass-made flask vessel having a volume of one liter, which was equipped with a thermometer, a reflux condenser, and a stirring device and which could be heated and cooled, 100 parts by mass of 1,6-dimaleimido-(2,2,4-trimethyl) hexane (a trade name: BMI-TMH, manufactured by Daiwa Fine Chemicals Co., Ltd.), 400 parts by mass of 2,2-bis[4-(4-maleimidophenoxy)phenyl]propane (a trade name: BMI-4000, manufactured by Daiwa Fine Chemicals Co., Ltd.), 70 parts by mass of 4,4'-[1,3-phenylenebis(1-methylethylidene)]bisaniline (a trade name: BISANILINE M, manufactured by Mitsui Fine Chemicals, Inc.), and 900 parts by mass of propylene glycol monomethyl ether were charged, and the contents were allowed to react with each other with stirring at a liquid temperature at 120° C. for 3 hours while refluxing.

Thereafter, the reaction product was confirmed to have a weight average molecular weight of 3,000 by means of a measurement method as mentioned later, cooled, and then subjected to 200-mesh filtration to produce a polyimide compound (a1) (solid content concentration: 65% by mass).

<Measurement Method of Weight Average Molecular Weight>

The weight average molecular weight of the resulting polyimide compound (a1) was converted from a calibration curve using standard polystyrene by means of gel permeation chromatography (GPC). The calibration curve was approximated according to a cubic expression using standard polystyrene: TSKstandard POLYSTYRENE (Type: A-2500, A-5000, F-1, F-2, F-4, F-10, F-20, F-40) [a trade name, manufactured by Tosoh Corporation]. A condition of GPC is as follows.

Apparatus:

(Pump: L-6200 Model [manufactured by Hitachi High-Technologies Corporation])

(Detector: L-3300 Model RI [manufactured by Hitachi High-Technologies Corporation])

(Column oven: L-655A-52 [manufactured by Hitachi High-Technologies Corporation])

Column: Guard column; TSK Guardcolumn HHR-L+ Column; TSK gel-G4000HHR+TSK gel-G2000HHR (all of which are a trade name, manufactured by Tosoh Corporation)

Column size: 6.0×40 mm (guard column), 7.8×300 mm (column)

Elute: Tetrahydrofuran

Sample concentration: 30 mg/5 mL

Injection amount: 20 μL

Flow rate: 1.00 mL/min

Measurement temperature: 40° C.

Production Method of Varnish for Layer A

Production Example 2[I] (Production of Varnish A1)

65% by volume (relative to the organic solvent-free whole volume) of aminosilane coupling agent-treated silica (a methyl isobutyl ketone dispersion liquid having a solid content concentration of 70% by mass, manufactured by Admatechs Co., Ltd.) as the inorganic filler (a2) and 20% by mass (relative to all of the resin components, namely relative to all of the components not containing the inorganic filler and the organic solvent) of a polybutadiene-based elastomer (a trade name: POLYVEST 75MA, manufactured by Evonik) as the elastomer (a3) were mixed.

The polyimide compound (a1) produced in Production Example 1[I] was then mixed therein in a ratio such that the content of the polyimide compound (a1) was 80% by mass relative to all of the resin components contained in the resin composition, and dissolved at room temperature by a high-speed rotary mixer.

After dissolution of the polyimide compound (a1) was confirmed through visual inspection, 1,3-phenylenebis(di-2,6-xylenyl phosphate) as a flame retardant, 4,4'-butylidenebis-(6-t-butyl-3-methylphenol) as an antioxidant, and a polyester-modified polydimethylsiloxane as a fluidity controlling agent were mixed. Thereafter, an organic peroxide (a trade name: PERBUTYL P, manufactured by NOF Corporation) in an amount of 1 phr relative to the amount of the raw material (maleimide compound) as converted from the charged amount of the polyimide compound (a1) and the amount of the polybutadiene-based elastomer (a3), and an isocyanate-masked imidazole (a trade name: G8009L, manufactured by Dai-ichi Kogyo Seiyaku Co., Ltd.) in an amount of 0.5 phr relative to the amount of the raw material maleimide compound as converted from the charged amount of the polyimide compound (a1) were mixed as curing accelerators. Subsequently, the mixture was dispersed by a nanomizer treatment, to obtain a varnish A1.

Production Example 3[I] (Production of Varnish A2)

A varnish A2 was obtained by performing the same operation as in Production Example 2[I], except for changing the use amount of the inorganic filler (a2) to 60% by volume.

Production Example 4[I] (Production of Varnish A3)

A varnish A3 was obtained by performing the same operation as in Production Example 2[I], except for changing the use amount of the inorganic filler (a2) to 57% by volume.

Production Example 6[I] (Production of Varnish A4: for Comparison)

A varnish A4 was obtained by performing the same operation as in Production Example 2[I], except for changing the use amount of the inorganic filler (a2) to 70% by volume.

Production Example 6[I] (Production of Varnish A5)

Aminosilane coupling agent-treated silica (a methyl isobutyl ketone dispersion liquid having a solid content concentration of 70% by mass, manufactured by Admatechs Co., Ltd.) as the inorganic filler (a2) and a polybutadiene-based elastomer (a trade name: POLYVEST 75MA, manufactured by Evonik) as the elastomer (a3) were mixed in a blending ratio such that the content of the inorganic filler (a2) was 77% by mass based on 100% by mass of the solid content contained in the resin composition, and that the content of the elastomer (a3) was 4% by mass based on 100% by mass of the solid content contained in the resin composition.

The polyimide compound (a1) obtained in Production Example 1[I] was then mixed therein in a ratio such that the content of the polyimide compound (a1) was 17% by mass relative to 100% by mass of the solid content contained in the resin composition, and dissolved at room temperature by a high-speed rotary mixer.

Other than that, the same operation as in Production Example 2[I] was performed, to obtain a varnish A5.

Production Example 7[I] (Production of Varnish A6)

A varnish A6 was obtained by performing the same operation as in Production Example 6[I], except for regulating such that the use amount of the inorganic filler (a2) was 65% by volume.

Production Method of Varnish for Layer B

Production Example 8[I] (Production of Varnish B1)

6 parts by mass of a phenolic hydroxy group-containing polybutadiene-modified polyamide resin (a trade name: BPAM-155, manufactured by Nippon Kayaku Co., Ltd.) was dissolved in a mixed solvent of dimethylacetamide and cyclohexanone [dimethylacetamide/cyclohexanone (mass ratio)=7/3]. After dissolution, 57 parts by mass of an aralkyl novolak type epoxy resin (a trade name: NC-3000H, manufactured by Nippon Kayaku Co., Ltd., epoxy equivalent: 289 g/mol), 9 parts by mass of an inorganic filler (a trade name: AEROSIL (registered trademark) R972, manufactured by Nippon Aerosil Co., Ltd., specific surface area: 110±20 m²/g), 0.4 parts by mass of an antioxidant, 9 parts by mass as expressed in terms of a solid content of a phenoxy resin, 15 parts by mass as expressed in terms of a solid content of an active ester curing agent [a trade name: HPC-8000-65T (toluene diluted product, concentration: 65% by mass), manufactured by DIC Corporation], 0.1 parts by mass as expressed in terms of a solid content of a fluidity controlling agent, and 3 parts by mass of a phosphorus-based curing accelerator (adduct of tri-n-butylphosphine and p-benzoquinone) were blended and dissolved, and the varnish was diluted with methyl ethyl ketone such that the solid content concentration was 18% by mass. Thereafter, the diluted varnish was dispersed by a nanomizer treatment, to obtain a varnish B1.

Production Example 9[I] (Production of Varnish B2)

A varnish B2 was obtained by performing the same operation as in Production Example 8[I], except for setting the blending amount of the aralkyl novolak type epoxy resin to 51 parts by mass and setting the blending amount of the phenoxy resin to 15 parts by mass as expressed in terms of a solid content.

Production Example 10[I] (Production of Varnish B3)

A varnish B3 was obtained by performing the same operation as in Production Example 8[I], except for setting the blending amount of the inorganic filler to 19 parts by mass.

[1. Measurement Method of Minimum Melt Viscosity]

Each of the varnishes A1 to A6 for layer A obtained in the aforementioned Production Examples was used and coated on a release-treated support (PET film) by using a comma coater such that the thickness after drying was 25 μm, followed by drying at 90° C. for 2 minutes, to form each of films A1 to A6 on the support.

Similarly, each of the varnishes B1 to B3 for layer B obtained in the aforementioned Production Examples was used and coated on a release-treated support (PET film) by using a comma coater such that the thickness after drying was 2.5 μm, followed by drying at 140° C. for 3 minutes, to form each of films B1 to B3 on the support.

With respect to these films A1 to A6 and B1 to B3, the melt viscosity was measured according to the following method.

With respect to the film A1, an arbitrary number of sheets were stuck at a temperature at which curing was not advanced, to prepare a single sheet having a thickness of 100 μm, and the sheet was cut into a size of 10 mm×10 mm, to provide a test piece A1. With respect to the films A2 to A6 and the films B1 to B3, test pieces A2 to A6 and test pieces B1 to B3 were prepared in the same method. In the preparation of the test pieces, the respective films were stuck to each other in an extent that exfoliation was not generated on the stuck surface during the following measurement of shear viscosity.

As for the melt viscosity, using a rotary type rheometer (ARES, manufactured by TA Instruments), the aforementioned film was sandwiched by parallel discs (diameter: 8 mm) with a gap width smaller by 2 to 5 μm than the film thickness, values of complex viscosity on the occasion of measuring at a frequency of 1 Hz and s strain of 1% while raising the temperature from 30° C. to 300° C. at a rate of 5° C./min were determined, and attention was paid to a minimum melt viscosity at 80 to 150° C. The minimum melt viscosity at 80 to 150° C. is shown in Table 1.

TABLE 1

|  | Film for layer A | | | | Film for layer B | |
| --- | --- | --- | --- | --- | --- | --- |
|  | A1 | A2 | A3 | A4 | B1 | B2 |
| Content proportion of inorganic filler (% by volume) | 65 | 60 | 57 | 70 | 0 | 0 |
| Minimum melt viscosity (Pa · s) | 1,800 | 1,200 | 800 | 5,000 | 68,400 | 66,200 |

|  | Film for layer A | | Film for layer B |
| --- | --- | --- | --- |
|  | A5 | A6 | B3 |
| Content proportion of inorganic filler (% by volume) | 57 | 65 | 0 |
| Minimum melt viscosity (Pa · s) | 400 | 1,500 | 80,000 |
| Elastic modulus (1 GPa, 200° C.) | 1.1 | 1.6 | — |
| Coefficient of thermal expansion (ppm/° C.) | 28 | 17 | — |

Production of Composite Film

Example 1[I]

The varnish B1 for layer B was coated on a release-treated support (PET film) by using a comma coater such that the thickness of the layer B after drying was 3 μm, followed by drying at 140° C. for 3 minutes, to form the layer B on the support.

Subsequently, the varnish A1 for layer A was coated on the resin layer of the layer B by using a comma coater such that the thickness of the layer A after drying was 37 μm, followed by drying at 90° C. for 2 minutes, to obtain a composite film.

Furthermore, the resultant was wound up in a roll state while sticking a polypropylene film having a thickness of 15 μm serving as a protective film onto the surface of the layer A, to obtain a composite film 1 having a support and a protective film.

Using the foregoing composite film, the respective evaluations were carried out according to the following methods. The results are shown in Table 2.

Examples 2[I] to 10[I] and Comparative Examples 1[I] to 4[I]

Each of composite films was obtained by performing the same operation as in Example 1[I], except for using each of varnishes shown in Table 2 and setting the film to a thickness shown in Table 2. Using each of the foregoing composite films, the respective evaluations were carried out according to the following methods. The results are shown in Table 2.

<Preparation of Resin Sheet>

A resin sheet used for the measurement of dielectric tangent was prepared according to the following procedures. (I) The protective film was exfoliated from the composite film having a support and a protective film obtained in each of the Examples, followed by drying at 120° C. for 3 minutes.

Subsequently, the composite film having a support after drying was laminated on a glossy surface of a copper foil (electrolytic copper foil, thickness: 35 μm) by using a vacuum & pressure laminator (a trade name: MVLP-500/600-II, manufactured by Meiki Co., Ltd.) such that the resin layer of the composite film and the copper foil came into contact with each other, to obtain a laminate (P) in which the copper foil, the composite film, and the support were laminated in this order. The lamination was performed by a method in which the pressure was reduced for 30 seconds to an extent of 0.5 MPa, and the resultant was then pressed at 120° C. for 30 seconds under a pressure bonding pressure of 0.5 MPa. Thereafter, the support was exfoliated from the laminate (P).

(II) Subsequently, another composite film having a PET film as a support and a polypropylene film as a protective film was prepared, and the protective film was exfoliated, followed by drying at 110° C. for 3 minutes.

(III) Subsequently, the laminate (P) obtained in the above (I), from which the support had been exfoliated, and the composite film having a support after drying as obtained in the above (II) were laminated under the same condition as in the above (I) such that the resin layers came into contact with each other, to obtain a laminate (Q) in which the copper foil, the layer composed of two layers of the composite film, and the support were laminated in this order. Thereafter, the support was exfoliated from the laminate (Q).

(IV) Subsequently, the laminate (Q) obtained in the above (III), from which the support had been exfoliated, and a composite film having a support after drying as obtained by the same method as in the above (II) were laminated under the same condition as in the above (I) such that the resin layers came into contact with each other, to obtain a laminate (R) in which the copper foil, the layer composed of three layers of the composite film, and the support were laminated in this order.

(V) A laminate (Q) was prepared in the same methods as in the above (I) to (III).

(VI) The supports of the laminate (Q) obtained in the above (V) and the laminate (R) obtained in the above (I) to (IV) were exfoliated, respectively, the resin layers of the laminate (Q) and the laminate (R) were stuck to each other, and the resultant was subjected to press molding using a vacuum press at 190° C. for 60 minutes under a pressure bonding pressure of 3.0 MPa. The resulting resin sheet provided with a copper foil on the both surfaces thereof was cured at 190° C. for 2 hours, and the copper foils were etched with ammonium persulfate, to obtain a resin sheet, which was then utilized for the measurement dielectric tangent.

[2. Measurement Method of Dielectric Tangent]

The above-prepared resin sheet was cut out into a test piece having a width of 2 mm and a length of 70 mm, which was then measured for dielectric tangent using a network analyzer (a trade name: E8364B, manufactured by Agilent Technologies) and a 5 GHz-enabled cavity resonator (manufactured by Kanto Electronic Application and Development Inc.). The measurement temperature was set to 25° C. It is indicated that the lower the dielectric tangent, the more excellent the dielectric characteristics are.

<Preparation Method of Board for Surface Roughness Measurement>

A board for surface roughness measurement was prepared according to the following procedures.

The composite film having a support and a protective film obtained in each of the Examples was cut into a size of 240 mm×240 mm, and the protective film was then exfoliated.

The resulting composite film having a support was laminated on a printed wiring board having been subjected to a CZ treatment (a trade name: E-700GR, manufactured by Hitachi Chemical Company, Ltd.) such that the layer A and the printed wiring board came into contact with each other. The lamination was performed by a method in which the resultant was pressed at 120° C. for 30 seconds under a pressure bonding pressure of 0.5 MPa.

Thereafter, the laminate was cooled to room temperature, to obtain a printed wiring board having a composite film disposed therein. Subsequently, the printed wiring board having a composite film disposed therein was cured as first-stage curing in an explosion-proof dryer at 130° C. for 20 minutes in a state of being provided with the support and then cured as second-stage curing in an explosion-proof dryer at 190° C. for 40 minutes. Thereafter, the support was exfoliated to obtain a printed wiring board having an interlayer insulating layer formed therein.

(Roughening Treatment Method)

The printed wiring board obtained by the aforementioned production method of a board for surface roughness measurement was subjected to a clipping treatment with a swelling solution heated at 60° C. (a trade name: SWELLING DIP SECURIGANTH (registered trademark) P, manufactured by Atotech Japan K.K.) for 10 minutes. Subsequently, the resulting test piece was subjected to a clipping treatment with a roughening solution heated at 80° C. (a trade name: CONCENTRATE COMPACT CP, manufactured by Atotech Japan K.K.) for 15 minutes. Subsequently, the resulting test piece was subjected to a clipping treatment with a neutralizing solution heated at 40° C. (a trade name: REDUCTION SOLUTION SECURIGANTH (registered trademark) P500, manufactured by Atotech Japan K.K.) for 5 minutes, thereby performing neutralization. In this way, the test piece in which the surface of the interlayer insulating layer had been subjected to a roughening treatment was used as the board for surface roughness measurement.

[3. Measurement Method of Surface Roughness: Surface Flatness]

A surface roughness of the thus obtained board for surface roughness measurement was measured with a non-contact type surface roughness meter (a trade name: WYKO NT9100, manufactured by Bruker AXS K.K.) using an internal lens of 1 time and an external lens of 50 times, to obtain an arithmetic average roughness (Ra), and the resulting arithmetic average roughness (Ra) was defined as an index for surface flatness.

From the viewpoint of surface flatness, it is preferred that the arithmetic average roughness (Ra) is smaller, and in particular, what it is less than 200 nm is suitable for the formation of a fine wiring. In addition, when the arithmetic average roughness (Ra) is 95 nm or more, sufficient peel strength can be exhibited. From this viewpoint, with respect to the surface flatness, the case where the surface roughness was less than 95 nm was evaluated as "b", the case where the surface roughness was 95 nm or more and less than 200 nm was evaluated as "a", and the case where the surface roughness was 200 nm or more was evaluated as "c".

[4. Evaluation Method of Adhesion to Plated Copper]

(4.1) Preparation Method of Board for Measurement of Adhesive Strength (Plating Peel Strength) to Plated Copper First of all, a printed wiring board provided with a composite film prepared by the same method as in the board for surface roughness measurement was cut out into a size of 40 mm×60 mm, to provide a test piece.

The test piece was subjected to a roughening treatment under the same condition as in the board for surface roughness measurement and then treated with an alkaline cleaner at 60° C. (a trade name: CLEANER SECURIGANTH (registered trademark) 902, manufactured by Atotech Japan K.K.) for 5 minutes, to perform degreasing cleaning. After cleaning, the resultant was treated with a predip liquid at 23° C. (a trade name: PREDIP NEOGANTH (registered trademark) B, manufactured by Atotech Japan K.K.) for 2 minutes. Thereafter, the resultant was treated with an activator liquid at 40° C. (a trade name: ACTIVATOR NEOGANTH (registered trademark) 834, manufactured by Atotech Japan K.K.) for 5 minutes, to attach a palladium catalyst thereto. Subsequently, the resultant was treated with a reducer liquid at 30° C. (a trade name: REDUCER NEOGANTH (registered trademark) WA, manufactured by Atotech Japan K.K.) for 5 minutes.

The thus treated test piece was put into a chemically copper enriched liquid (a trade name: BASIC PRINTGANTH (registered trademark) MSK-DK, manufactured by Atotech Japan K.K.) and subjected to electroless plating until the thickness of the plating on the interlayer insulating layer became 1 μm. After the electroless plating, in order to release a stress remaining in the plated film and remove a residual hydrogen gas, a baking treatment was performed at 120° C. for 15 minutes.

Subsequently, the electroless plated test piece was further subjected to electroplating until the thickness of the plating on the interlayer insulating layer became 35 μm, to form a copper layer as the conductor layer. After the electroplating, the resultant was subjected to an annealing treatment at 190° C. for 120 minutes, to obtain a measurement board before preparation of adhesive strength measurement part.

A resist having a width of 10 mm was formed on the copper layer of the resulting measurement board, and the copper layer was etched with ammonium persulfate, to obtain a board for measurement of adhesive strength to plated copper, having a copper layer having a width of 10 mm as the adhesive strength measurement part.

(4.2) Measurement Condition of Adhesive Strength (Plating Peel Strength) to Plated Copper A load at the time when one end of the copper layer of the adhesive strength measurement part formed on the board for adhesive strength measurement was taken off at an interface between the copper layer and the interlayer insulating layer, grasped by a gripper, and then ripped at room temperature at a tensile rate in the vertical direction of 50 mm/min using a compact table-top tester (a trade name: EZT Test, manufactured by Shimadzu Corporation) was measured, and the resulting adhesive strength (kN/m) was defined as an index for adhesion to plated copper. It is indicated that the larger the value, the higher the adhesion to plated copper is.

[5. Evaluation Method of Embedding Properties]

The composite film obtained in each of the Examples was cut into a size of 240 mm×240 mm, and the protective film was then exfoliated.

The resulting composite film (provided with a support) was laminated on a printed wiring board having a thickness of 18 μm and having both a copper wiring in a width of 5 mm and a copper wiring in a width of 100 μm formed thereon (a trade name: E-700GR, manufactured by Hitachi Chemical Company, Ltd.) such that the first resin layer and the printed wiring board came into contact with each other. The lamination was performed by a method in which the resultant was evacuated at 100° C. for 15 seconds and then pressurized at 0.5 MPa for 45 seconds as a first stage, and subsequently pressed at 120° C. for 60 seconds under a pressure bonding pressure of 0.5 MPa as a second stage. Thereafter, the laminate was cooled to room temperature, to obtain a printed wiring board having a composite film disposed therein.

Subsequently, the printed wiring board having a composite film disposed therein was cured as first-stage curing in an explosion-proof dryer at 130° C. for 20 minutes in a state of being provided with the support and then cured as second-stage curing in an explosion-proof dryer at 190° C. for 40 minutes, to obtain a printed wiring board having an interlayer insulating layer formed thereon. Thereafter, the support was exfoliated to obtain a printed wiring board.

The copper wiring portion of this printed wiring board was observed through visual inspection. The case where both the embedding properties and the flatness of the copper wiring in a width of 5 mm and the copper wiring in a width of 100 μm were excellent was evaluated as "A", and the case where both the embedding properties and the flatness were poor was evaluated as "C".

TABLE 2

| | | Example [I] | | | | | Comparative Example [I] | | |
| --- | --- | --- | --- | --- | --- | --- | --- | --- | --- |
| | | 1 | 2 | 3 | 4 | 5 | 1 | 2 | 3 |
| Layer A | Film | A1 | A1 | A2 | A3 | A1 | A4 | A4 | A1 |
| | Thickness (μm) | 37 | 37 | 37 | 37 | 27 | 17 | 37 | 30 |
| Layer B | Film | B1 | B2 | B1 | B1 | B1 | B1 | B1 | — |
| | Thickness (μm) | 3 | 3 | 3 | 3 | 3 | 3 | 3 | — |
| Total thickness (μm) | | 40 | 40 | 40 | 40 | 30 | 20 | 40 | 20 |
| Evaluation results | Dielectric tangent (5 GHz) | 0.0035 | 0.0034 | 0.0035 | 0.0036 | 0.0034 | 0.0060 | 0.0036 | 0.0030 |
| | Surface roughness (nm) | 89 | 110 | 160 | 110 | 140 | 120 | 110 | 340 |
| | Surface flatness | b | a | a | a | a | a | a | c |
| | Plating peel strength (kN/m) | 0.65 | 0.62 | 0.65 | 0.65 | 0.61 | 0.65 | 0.60 | 0.11 |
| | Embedding properties | A | A | A | A | A | C | C | A |

| | | Example [I] | | | | | Comparative Example [I] |
| --- | --- | --- | --- | --- | --- | --- | --- |
| | | 6 | 7 | 8 | 9 | 10 | 4 |
| Layer A | Film | A5 | A5 | A5 | A5 | A6 | A5 |
| | Thickness (μm) | 35 | 35 | 29 | 27 | 27 | 30 |
| Layer B | Film | B3 | B3 | B3 | B3 | B3 | — |
| | Thickness (μm) | 5 | 3 | 1 | 3 | 3 | — |
| Total thickness (μm) | | 40 | 38 | 30 | 30 | 30 | 30 |
| Evaluation results | Surface roughness (nm) | 89 | 110 | 160 | 110 | 140 | 340 |
| | Surface flatness | b | a | a | a | a | c |
| | Plating peel strength (kN/m) | 0.72 | 0.68 | 0.58 | 0.61 | 0.65 | 0.11 |
| | Embedding properties | A | A | A | A | A | A |

From Table 2, it is noted that the printed wiring boards of the Examples are small in the dielectric tangent and excellent in the embedding properties relative to unevenness of a circuit, etc., and further that in spite of small surface roughness (namely, excellent surface flatness), they each have an interlayer insulating layer with excellent adhesion to plated copper, and hence, they are suitable for the formation of a fine wiring.

Next, Examples regarding the embodiment capable of solving the problem [II] of the present invention are described.

Production Example 1[II]

<Production of Thermosetting Resin (A)>

A polyimide compound (a1) (solid content concentration: 65% by mass) that is the thermosetting resin (A) was produced in the same manner as in the Production Example 1[I].

Production of Varnish for Second Resin Layer (Layer B)

Production Example 2[II]

A varnish for second resin layer was obtained in the same manner as in the Production Example 8[I].

Production of Varnish for First Resin Layer (Layer A)

Production Example 3[II]

(Production of Varnish A for First Resin Layer)

The inorganic filler (B) and the elastomer (C) were mixed in a blending composition as shown in Table 3 (in Table 3, the unit of the blending amount of the varnish for first resin layer is a part by mass, and in the blending amount in Table 3, the blending amount of the solution or dispersion liquid (but excluding the solvent) means is an amount as expressed in terms of a solid content). The thermosetting resin (A) [polyimide compound (a1)] produced in Production Example 1[II] was then mixed therein and dissolved at room temperature by a high-speed rotary mixer. After dissolution of the thermosetting resin (A) [polyimide compound (a1)] was confirmed through visual inspection, a flame retardant, an antioxidant, a fluidity controlling agent, and a curing accelerator were mixed in a blending composition shown in Table 3 and subsequently dispersed by a nanomizer treatment, to obtain a varnish A for first resin layer.

Thereafter, the high-boiling solvent (X) described in Table 3 was mixed such that its content in all of the solvent components of the varnish was 3% by mass.

Subsequently, the resultant was dispersed by a nanomizer treatment, to obtain a varnish A (solid content concentration: 70% by mass) for preparing a resin film for interlayer insulation.

Production Examples 4[II] to 10[II]

(Production of Varnishes B to H for First Resin Layer)

Each of varnishes B to H for first resin layer was obtained in the same manner as in the varnish A for first resin layer, except for changing the blending composition as shown in Table 3.

Production of Composite Film

Example 1[II]

The varnish for second resin layer obtained in each of the aforementioned Production Examples was coated on a release-treated support (PET film, thickness: 38 μm) by using a comma coater such that the thickness after drying was 3.0 μm, followed by drying at 140° C. for 3 minutes, to form a second resin layer on the support. Subsequently, the varnish A for first resin layer was coated on the second resin layer by using a comma coater such that the thickness of the first resin layer after drying was 37 μm, followed by drying at 90° C. for 2 minutes. Subsequently, the resultant was wound up in a roll state while sticking a polypropylene film having a thickness of 15 μm serving as a protective film onto the surface of the first resin layer, to obtain a composite film 1 having a support and a protective film.

Using the foregoing composite film, the respective evaluations were carried out according to the following methods. The results are shown in Table 3.

Examples 2[II] to 7[II] and Reference Example 1[II]

Each of composite films 2 to 8 was obtained by performing the same operation as in Example 1[II], except for using each of the varnishes B to H for first resin layer in place of the varnish A for first resin layer. Using each of the foregoing composite films, the respective evaluations were carried out according to the following methods. The results are shown in Table 3.

[Evaluation Method of Handling Properties of Film]

The handling properties of the composite film having a support and a protective film obtained in each of the Examples with respect to one immediately after exfoliating the protective film and one after exfoliating the protective film and then allowing to stand at room temperature (25° C.) for 24 hours were evaluated by the following methods.

(1) Evaluation by Cutting with Cutter:

The presence or absence of powder dropping on the occasion of cutting the thus prepared composite film having a support and a protective film with a cutter was evaluated. The presence or absence of powder dropping was confirmed through visual inspection, and in the case where no powder dropping was observed, the handling properties were evaluated to be excellent.

(2) Evaluation by Bending:

When the protective film was exfoliated from the thus prepared composite film having a support and a protective film, and the resultant was bent at 180° from the support toward the resin-coated surface, the presence or absence of cracking of the film was evaluated. The presence or absence of cracking of the film was confirmed through visual inspection, and in the case where no cracking was generated, the handling properties were evaluated to be excellent.

In the evaluations of the above (1) and (2), the case where all of the handling properties were excellent was designated as "A"; the case where the handling properties were excellent n either one of the above (1) and (2) was designated as "B"; and the case other than that was designated as "C".

[Measurement Method of Minimum Melt Viscosity]

The minimum melt viscosity of the composite film obtained in each of the Examples with respect to one immediately after exfoliating the protective film and one after exfoliating the protective film and then allowing to stand at room temperature (25° C.) for 24 hours was evaluated by the following method.

Using a sample prepared by piling up the composite films obtained in each of the Examples in a thickness of 1.0 mm and punching out in a size of ϕ20 mm, the minimum melt viscosity was measured. The viscosity was measured with a rheometer (a trade name: ARESG2, manufactured by TA Instruments Japan, Inc.) at a temperature rise rate of 5° C./min with a tool of ϕ20 mm at a frequency of 1.0 Hz. The minimum melt viscosity as referred to herein is a viscosity when the thermosetting resin composition was melted before commencement of curing.

[Measurement Method of Content of High-Boiling Solvent (X) in Insulating Resin Material]

The varnish for first resin layer obtained in each of the Examples was coated on a release-treated support (PET film, a trade name: CERAPEEL (registered trademark) SY(RX), manufactured by Toray Advanced Film Co., Ltd., thickness: 38 μm) by using a comma coater such that the thickness of the first resin layer after drying was 37 μm, followed by drying at 90° C. for 2 minutes. Subsequently, the resultant was wound up in a roll state while sticking a polypropylene film having a thickness of 15 μm serving as a protective film onto the surface of the first resin layer, to obtain a film for test having a support and a protective film.

The film for test was heated at 180° C. for 30 minutes, and the content of the high-boiling solvent (X) in the first resin layer (insulating resin material) was calculated from the weights before and after heating according to the following formula.

Content (% by mass) of high-boiling solvent (X) in insulating resin material=[{(Weight of insulating resin material before heating)−(Weight of insulating resin material after heating)}×100]/(Weight of insulating resin material before heating)

[Preparation of Resin Sheet]

A resin sheet to be used for the measurement of dielectric tangent and coefficient of thermal expansion was prepared according to the following procedures.

(I) The protective film was exfoliated from the composite film having a support and a protective film obtained in each of the Examples, followed by drying at 120° C. for 5 minutes.

Subsequently, the composite film having a support after drying was laminated on a glossy surface of a copper foil (electrolytic copper foil, thickness: 35 μm) by using a vacuum & pressure laminator (a trade name: MVLP-500/600-II, manufactured by Meiki Co., Ltd.) such that the resin layer and the copper foil came into contact with each other, to obtain a laminate (P) in which the copper foil, the composite film, and the support were laminated in this order. The lamination was performed by a method in which the pressure was reduced for 30 seconds to an extent of 0.5 MPa, and the resultant was then pressed at 120° C. for 30 seconds under a pressure bonding pressure of 0.5 MPa. Thereafter, the support was exfoliated from the laminate (P).

(II) Subsequently, another composite film having a support and a protective film was prepared, and the protective film was exfoliated, followed by drying at 110° C. for 3 minutes.

(III) Subsequently, the laminate (P) obtained in the above (I), from which the support had been exfoliated, and the composite film having a support after drying as obtained in the above (II) were laminated under the same condition as in the above (I) such that the resin layers came into contact with each other, to obtain a laminate (Q) in which the copper foil, the layer composed of two layers of the composite film, and the support were laminated in this order. Thereafter, the support was exfoliated from the laminate (Q).

(IV) Subsequently, the laminate (Q) obtained in the above (III), from which the support had been exfoliated, and a composite film having a support after drying as obtained by the same method as in the above (II) were laminated under the same condition as in the above (I) such that the resin layers came into contact with each other, to obtain a laminate (R) in which the copper foil, the layer composed of three layers of the composite film, and the support were laminated in this order.

(V) A laminate (Q) was prepared in the same methods as in the above (I) to (III).

(VI) The supports of the laminate (Q) obtained in the above (V) and the laminate (R) obtained in the above (I) to (IV) were exfoliated, respectively, the resin layers of the laminate (Q) and the laminate (R) were stuck to each other, and the resultant was subjected to press molding using a vacuum press at 190° C. for 60 minutes under a pressure bonding pressure of 3.0 MPa. The resulting resin sheet provided with a copper foil on the both surfaces thereof was cured at 190° C. for 2 hours, and the copper foils were etched with ammonium persulfate, to obtain a resin sheet.

[Measurement Method of Dielectric Tangent]

The thus prepared resin sheet was cut out into a test piece having a width of 2 mm and a length of 70 mm, which was then measured for dielectric tangent using a network analyzer (a trade name: E8364B, manufactured by Agilent Technologies) and a 5 GHz-enabled cavity resonator (manufactured by Kanto Electronic Application and Development Inc.). The measurement temperature was set to 25° C. It is indicated that the lower the dielectric tangent, the more excellent the dielectric characteristics are.

[Measurement Method of Coefficient of Thermal Expansion]

The thus prepared resin sheet was cut out into a test piece having a width of 4 mm and a length of 15 mm, which was then measured for coefficient of thermal expansion using a thermal stress strain measurement apparatus (model: TMA/SS6100 Type, manufactured by Seiko Instruments Inc.). As for the coefficient of thermal expansion, on the occasion when the test piece was heated (1st) from room temperature to 260° C. under a condition at a temperature rise rate of 10° C./min under a load of 0.05 N and then cooled from 260° C. to −30° C., followed by heating (2nd) from −30° C. to 300° C., a value of average coefficient of thermal expansion (ppm/° C.) in the range of from 30° C. to 120° C. at the second heating was designated as the coefficient of thermal expansion.

[Measurement Method of Surface Roughness]

(1) Preparation Method of Board for Surface Roughness Measurement

A board for surface roughness measurement was prepared according to the following procedures.

The composite film having a support and a protective film obtained in each of the Examples was cut into a size of 240 mm×240 mm, and the protective film was then exfoliated.

The resulting composite film having a support was laminated on a printed wiring board having been subjected to a CZ treatment (a trade name: E-700GR, manufactured by Hitachi Chemical Company, Ltd.) such that the first resin layer and the printed wiring board came into contact with each other. The lamination was performed by a method in which after reducing the pressure for 15 seconds, the resultant was pressurized at 100° C. for 45 seconds under a pressure bonding pressure of 0.5 MPa and then pressed at 120° C. for 60 seconds under a pressure bonding pressure of 0.5 MPa.

Thereafter, the laminate was cooled to room temperature, to obtain a printed wiring board. Subsequently, the printed wiring board having the composite film disposed therein was cured as first-stage curing in an explosion-proof dryer at 130° C. for 20 minutes in a state of being provided with the support and then cured as second-stage curing in an explosion-proof dryer at 190° C. for 40 minutes. After curing, the support was exfoliated to obtain a printed wiring board having an interlayer insulating layer formed therein.

The thus obtained printed wiring board was subjected to a dipping treatment with a swelling solution heated at 60° C. (a trade name: SWELLING DIP SECURIGANTH (registered trademark) P, manufactured by Atotech Japan K.K.) for 10 minutes. Subsequently, the resulting test piece was subjected to a clipping treatment with a roughening solution heated at 80° C. (a trade name: CONCENTRATE COMPACT CP, manufactured by Atotech Japan K.K.) for 15 minutes. Subsequently, the resulting test piece was subjected to a clipping treatment with a neutralizing solution heated at 40° C. (a trade name: REDUCTION SOLUTION SECURIGANTH (registered trademark) P500, manufactured by Atotech Japan K.K.) for 5 minutes, thereby performing neutralization. In this way, the test piece in which the surface of the interlayer insulating layer had been subjected to a roughening treatment was used as the board for surface roughness measurement.

(2) Measurement Condition of Surface Roughness

A surface roughness of the thus obtained board for surface roughness measurement was measured with a non-contact type surface roughness meter (a trade name: WYKO NT9100, manufactured by Bruker AXS K.K.) using an internal lens of 1 time and an external lens of 50 times, to obtain an arithmetic average roughness (Ra). In view of the gist of the present invention, it is preferred that Ra is smaller, and what it is less than 200 nm is suitable for the formation of a fine wiring.

[Measurement Method of Adhesive Strength to Plated Copper]

(1) Preparation Method of Board for Measurement of Adhesive Strength (Plating Peel Strength) to Plated Copper First of all, a printed wiring board provided with a composite film prepared by the same method as in the board for surface roughness measurement was cut out into a size of 40 mm×60 mm, to provide a test piece.

The test piece was subjected to a roughening treatment under the same condition as in the board for surface roughness measurement and then treated with an alkaline cleaner at 60° C. (a trade name: CLEANER SECURIGANTH (registered trademark) 902, manufactured by Atotech Japan K.K.) for 5 minutes, to perform degreasing cleaning. After cleaning, the resultant was treated with a predip liquid at 23° C. (a trade name: PREDIP NEOGANTH (registered trademark) B, manufactured by Atotech Japan K.K.) for 2 minutes. Thereafter, the resultant was treated with an activator liquid at 40° C. (a trade name: ACTIVATOR NEOGANTH (registered trademark) 834, manufactured by Atotech Japan K.K.) for 5 minutes, to attach a palladium catalyst thereto. Subsequently, the resultant was treated with a reducer liquid at 30° C. (a trade name: REDUCER NEOGANTH (registered trademark) WA, manufactured by Atotech Japan K.K.) for 5 minutes.

The thus treated test piece was put into a chemically copper enriched liquid (a trade name: BASIC PRINTGANTH (registered trademark) MSK-DK, manufactured by Atotech Japan K.K.) and subjected to electroless plating until the thickness of the plating on the interlayer insulating layer became 0.5 μm. After the electroless plating, in order to release a stress remaining in the plated film and remove a residual hydrogen gas, a baking treatment was performed at 120° C. for 15 minutes.

Subsequently, the electroless plated test piece was further subjected to electroplating until the thickness of the plating on the interlayer insulating layer became 35 μm, to form a copper layer as the conductor layer. After the electroplating, the resultant was subjected to an annealing treatment at 190° C. for 120 minutes, to obtain a measurement board before preparation of adhesive strength measurement part.

A resist having a width of 10 mm was formed on the copper layer of the resulting measurement board, and the copper layer was etched with ammonium persulfate, to obtain a board for measurement of adhesive strength to plated copper, having a copper layer having a width of 10 mm as the adhesive strength measurement part.

(2) Measurement Condition of Adhesive Strength to Plated Copper

A load at the time when one end of the copper layer of the adhesive strength measurement part formed on the board for adhesive strength measurement was taken off at an interface between the copper layer and the interlayer insulating layer, grasped by a gripper, and then ripped at room temperature at a tensile rate in the vertical direction of 50 mm/min using a compact table-top tester (a trade name: EZT Test, manufactured by Shimadzu Corporation) was measured.

[Measurement Method of Wiring Embedding Properties]

The wiring embedding properties of the composite film obtained in each of the Examples with respect to one immediately after exfoliating the protective film and one after exfoliating the protective film and then allowing to stand at room temperature (25° C.) for 24 hours were evaluated by the following methods.

The composite film having a support and a protective film obtained in each of the Examples was cut into a size of 240 mm×240 mm, and the protective film was then exfoliated. The resulting composite film having a support was laminated on a printed wiring board having a thickness of 18 μm and having both a copper wiring in a width of 5 mm and a copper wiring in a width of 100 μm formed thereon (a trade name: E-700GR, manufactured by Hitachi Chemical Company, Ltd.) such that the first resin layer and the printed wiring board came into contact with each other. The lamination was performed by a method in which the resultant was evacuated at 100° C. for 15 seconds and then pressurized under a pressure bonding pressure of 0.5 MPa for 45 seconds as a first stage, and subsequently pressed at 120° C. for 60 seconds under a pressure bonding pressure of 0.5 MPa as a second stage. Thereafter, the laminate was cooled to room temperature, to obtain a printed wiring board having a composite film disposed therein.

Subsequently, the printed wiring board having a composite film disposed therein was cured as first-stage curing in an explosion-proof dryer at 130° C. for 20 minutes in a state of being provided with the support and then cured as second-stage curing in an explosion-proof dryer at 190° C. for 40 minutes, to obtain a printed wiring board having an interlayer insulating layer formed thereon. Thereafter, the support was exfoliated to obtain a printed wiring board.

The copper wiring portion of this printed wiring board was observed through visual inspection. The case where both the embedding properties and the flatness of the copper wiring in a width of 5 mm and the copper wiring in a width of 100 μm were excellent was evaluated as "A"; the case where either one of the embedding properties and the flatness of the copper wiring in a width of 5 mm and the copper wiring in a width of 100 μm was excellent was evaluated as "B"; and the case where both the embedding properties and the flatness of the copper wiring in a width of 5 mm and the copper wiring in a width of 100 μm were poor was evaluated as "C".

TABLE 3

| | | | Example [II] | | | | |
|---|---|---|---|---|---|---|---|
| | | | 1 | 2 | 3 | 4 | 5 |
| Number of composite film | | | 1 | 2 | 3 | 4 | 5 |
| Kind of varnish for first resin layer | | | A | B | C | D | E |
| Blending composition of varnish for first resin layer | Thermosetting resin (A) | Polyimide compound (a1) (part by mass) | 11.9 | 11.9 | 11.9 | 11.9 | 11.9 |
| | Inorganic filler (B) | (part by mass) | 54.1 | 54.1 | 54.1 | 54.1 | 54.1 |
| | Elastomer (C) | POLYVEST 75MA (part by mass) | 3.0 | 3.0 | 3.0 | 3.0 | 3.0 |
| | Flame retardant | (part by mass) | 0.7 | 0.7 | 0.7 | 0.7 | 0.7 |
| | Antioxidant | (part by mass) | 0.1 | 0.1 | 0.1 | 0.1 | 0.1 |
| | Fluidity controlling agent | (part by mass) | 0.1 | 0.1 | 0.1 | 0.1 | 0.1 |
| | Curing accelerator | PERBUTYL P (phr) (*1) | 0.1 | 0.1 | 0.1 | 0.1 | 0.1 |
| | | G8009L (phr) (*2) | 0.03 | 0.03 | 0.03 | 0.03 | 0.03 |
| | High-boiling solvent (X) (part by mass) | N-Methylpyrrolidone | 0.9 | | | | |
| | | N,N-Dimethylacetamide | | 0.9 | | | |
| | | Cyclohexanone | | | 0.9 | | |
| | | γ-Butyrolactone | | | | 0.9 | |
| | | Methyl carbitol | | | | | 0.9 |
| | | Mesitylene | | | | | |
| | | IPSOL 150 | | | | | |
| | Solvent (Y) (part by mass) | Methyl ethyl ketone | 22.5 | 22.5 | 22.5 | 22.5 | 22.5 |
| | | 1-Methoxy-2-propanol | 6.6 | 6.6 | 6.6 | 6.6 | 6.6 |
| Content of high-boiling solvent (X) in first resin layer (solid content of insulating resin material) (% by mass) | | | 4.6 | 4.6 | 4.6 | 4.6 | 4.6 |
| Evaluation results | Handling properties of film | Immediately after exfoliating protective film | A | B | B | C | C |
| | | After elapsing 24 hours at 25° C. | A | B | B | C | C |
| | Minimum melt viscosity (Pa·s) | Immediately after exfoliating protective film | 480 | 480 | 480 | 480 | 480 |
| | | After elapsing 24 hours at 25° C. | 530 | 800 | 1010 | 1250 | 1200 |
| | Wiring embedding properties | Immediately after exfoliating protective film | A | A | A | A | A |
| | | After elapsing 24 hours at 25° C. | A | A | A | B | B |
| | Dielectric tangent (5 GHz) | | 0.0035 | 0.0035 | 0.0035 | 0.0035 | 0.0034 |
| | Coefficient of thermal expansion (ppm/° C.) | | 18 | 18 | 18 | 18 | 18 |
| | Surface roughness (nm) | | 120 | 120 | 110 | 110 | 120 |
| | Plating peel strength (kN/m) | | 0.55 | 0.54 | 0.55 | 0.54 | 0.54 |

| | | | Example [II] | | Reference Example [II] |
|---|---|---|---|---|---|
| | | | 6 | 7 | 1 |
| Number of composite film | | | 6 | 7 | 8 |
| Kind of varnish for first resin layer | | | F | G | H |
| Blending composition of varnish for first resin layer | Thermosetting resin (A) | Polyimide compound (a1) (part by mass) | 11.9 | 11.9 | 11.9 |
| | Inorganic filler (B) | (part by mass) | 54.1 | 54.1 | 54.1 |
| | Elastomer (C) | POLYVEST 75MA (part by mass) | 3.0 | 3.0 | 3.0 |
| | Flame retardant | (part by mass) | 0.7 | 0.7 | 0.7 |
| | Antioxidant | (part by mass) | 0.1 | 0.1 | 0.1 |
| | Fluidity controlling agent | (part by mass) | 0.1 | 0.1 | 0.1 |
| | Curing accelerator | PERBUTYL P (phr) (*1) | 0.1 | 0.1 | 0.1 |
| | | G8009L (phr) (*2) | 0.03 | 0.03 | 0.03 |
| | High-boiling solvent (X) (part by mass) | N-Methylpyrrolidone | | | |
| | | N,N-Dimethylacetamide | | | |
| | | Cyclohexanone | | | |
| | | γ-Butyrolactone | | | |
| | | Methyl carbitol | | | |
| | | Mesitylene | 0.9 | | |
| | | IPSOL 150 | | 0.9 | |
| | Solvent (Y) (part by mass) | Methyl ethyl ketone | 22.5 | 22.5 | 23.4 |
| | | 1-Methoxy-2-propanol | 6.6 | 6.6 | 6.6 |
| Content of high-boiling solvent (X) in first resin layer (solid content of insulating resin material) (% by mass) | | | 4.6 | 4.6 | 0 |

TABLE 3-continued

| Evaluation results | Handling properties of film | Immediately after exfoliating protective film | C | C | C |
|---|---|---|---|---|---|
| | | After elapsing 24 hours at 25° C. | C | C | C |
| | Minimum melt viscosity (Pa · s) | Immediately after exfoliating protective film | 480 | 480 | 480 |
| | | After elapsing 24 hours at 25° C. | 1210 | 1300 | 3500 |
| | Wiring embedding properties | Immediately after exfoliating protective film | A | A | A |
| | | After elapsing 24 hours at 25° C. | B | B | C |
| | Dielectric tangent (5 GHz) | | 0.0035 | 0.0035 | 0.0033 |
| | Coefficient of thermal expansion (ppm/° C.) | | 18 | 18 | 18 |
| | Surface roughness (nm) | | 110 | 110 | 153 |
| | Plating peel strength (kN/m) | | 0.55 | 0.54 | 0.56 |

(*1): Charged amount (phr) based on 100 parts by mass of the total amount of the amount of the raw material maleimide compound, as converted from the charged amount of the polyimide compound (a1), and the amount of the elastomer (C)
(*2): Charged amount (phr) based on 100 parts by mass of the amount of the raw material maleimide compound as converted from the charged amount of the polyimide compound (a1)

The details of the respective components shown in Table 3 are as follows.

Polyimide compound (a1): Polyimide compound produced in Production Example 1[II]

Inorganic filler (B): Aminosilane coupling agent-treated silica (methyl isobutyl ketone dispersion liquid having a solid content concentration of 70% by mass, manufactured by Admatechs Co., Ltd., average particle diameter: 0.5 μm)

POLYVEST (registered trademark) 75MA: Polybutadiene-based elastomer (a trade name, manufactured by Evonik; number of maleic anhydride-modified groups: 2)

Flame retardant: 1,3-Phenylenebis(di-2,6-xylenyl phosphate) (manufactured by Daihachi Chemical Industry Co., Ltd.)

Antioxidant: 4,4'-Butylidenebis-(6-t-butyl-3-methylphenol) (manufactured by Mitsubishi Chemical Corporation)

Fluidity controlling agent: Silicon-based surface controlling agent (xylene solution having a solid content concentration of 25% by mass, manufactured by BYK Japan KK)

PERBUTYL P: α,α'-Di(tert-butylperoxy)diisopropylbenzene (a trade name, manufactured by NOF Corporation)

G8009L: Isocyanate-masked imidazole (a trade name, manufactured by Dai-ichi Kogyo Seiyaku Co., Ltd.)

N-Methylpyrrolidone (manufactured by Tokyo Chemical Industry Co., Ltd., boiling point: 202° C.)

N,N-Dimethylacetamide (manufactured by Wako Pure Chemical Industries, Ltd., boiling point: 165° C.)

Cyclohexanone (manufactured by Wako Pure Chemical Industries, Ltd., boiling point: 156° C.)

γ-Butyrolactone (manufactured by Wako Pure Chemical Industries, Ltd., boiling point: 204° C.)

Methyl carbitol (manufactured by Tokyo Chemical Industry Co., Ltd., boiling point: 194° C.)

Mesitylene (manufactured by Tokyo Chemical Industry Co., Ltd., boiling point: 194° C.)

IPSOL 150 (manufactured by Idemitsu Kosan Co., Ltd., boiling point: 190 to 200° C.)

Methyl ethyl ketone (boiling point: 79.6° C.)

1-Methoxy-2-propanol (boiling point: 119° C.)

From Table 3, the resin sheets obtained by using the composite films of Examples 1[II] to 7[II] were small in the dielectric tangent and low in the coefficient of thermal expansion. In addition, the composite films of Examples 1[II] to 7[II] were low in the minimum melt viscosity, were significantly reduced with respect to an increase of the minimum melt viscosity after elapsing 24 hours at room temperature, and were excellent in the wiring embedding properties. Furthermore, the composite films of Examples 1[II] to 3[II] were also excellent in the handling properties of film.

In addition, it is noted that in the printed wiring boards obtained by using the composite films of Examples 1[II] to 7[II], in spite of having a smooth surface (low surface roughness (Ra)), when provided with an adhesive layer to form a composite film, they have an interlayer insulating layer with excellent adhesive strength to plated copper, and hence, they are suitable for the formation of a fine wiring.

Next, Examples regarding the embodiment capable of solving the problem [III] of the present invention are described.

Production Example 1[III]

<Production of Thermosetting Resin (A)>

A polyimide compound (a1) (solid content concentration: 65% by mass) that is the thermosetting resin (A) was produced in the same manner as in Production Example 1[I].

Production of Varnish for Second Resin Layer (Layer B)

Production Example 2[III]

A varnish for second resin layer was obtained in the same manner as in Production Example 8[I].

Production of Varnish for First Resin Layer (Layer A)

Production Example 3[III]

(Production of Varnish A for First Resin Layer)

The inorganic filler (B) and the conjugated diene-based elastomer (C') were mixed in a blending composition as shown in Table 4 (in the table, the content (part by mass) is the content relative to the solid content of the resin composition and in the case of the solution or dispersion liquid, is an amount as expressed in terms of a solid content). The thermosetting resin (A) [polyimide compound (a1)] produced in Production Example 1[III] was then mixed therein and dissolved at room temperature by a high-speed rotary mixer. After dissolution of the thermosetting resin (A) was confirmed through visual inspection, a flame retardant, an antioxidant, a fluidity controlling agent, and a curing accelerator were mixed in a blending composition shown in Table 4. Subsequently, the mixture was dispersed by a nanomizer treatment, to obtain a varnish A for first resin layer.

Production Examples 4[III] to 10[III]

(Production of Varnishes B to H for First Resin Layer)

Each of varnishes B to H for first resin layer was obtained in the same manner as in the varnish A for first resin layer, except for changing the blending composition as shown in Table 4.

Production of Composite Film

Example 1[III]

A composite film 1 was obtained in the same manner as in Example 1[II], except for changing the varnish A for first resin layer to the varnish A for first resin layer obtained in Production Example 3[III]. Using the foregoing composite film, the respective evaluations were carried out according to the following methods. The results are shown in Table 4.

Examples 2[III] to 4[III] and Reference Examples 1[III] to 4[III]

Each of composite films 2 to 8 was obtained by performing the same operation as in Example 1[III], except for using each of the varnishes B to H for first resin layer obtained in Production Examples 4[III] to 10[III] in place of the varnish A for first resin layer. Using each of the foregoing composite films, the respective evaluations were carried out according to the following methods. The results are shown in Table 4.
[Evaluation of Handling Properties of Film]

The evaluation of handling properties of film was carried out in the same method as that described in the Examples regarding the embodiment capable of solving the problem [II].
[Presence or Absence of Resin Separation after Lamination]

The presence or absence of resin separation was confirmed through observation of a cross section of an interlayer insulating layer formed on a printed wiring board with a scanning electron microscope (SEM). The protective film of the resin film for interlayer insulation having a support and a protective film obtained in each of the Examples was exfoliated, and the resultant was laminated on a printed wiring board having been subjected to a CZ treatment (MCL-E-700GR (a trade name, manufactured by Hitachi Chemical Company, Ltd.) was used as a laminated sheet) such that the resin film for interlayer insulation and the printed wiring board came into contact with each other. The lamination was performed by a method in which the pressure was reduced for 30 seconds to an extent of 0.5 MPa, and the resultant was then pressed at 130° C. for 30 seconds under a pressure bonding pressure of 0.5 MPa. Thereafter, the laminate was cooled to room temperature, and the support was exfoliated and removed to obtain a printed wiring board having the resin film for interlayer insulation disposed therein. Subsequently, the printed wiring board was heated in an explosion-proof dryer at 190° C. for 60 minutes, to obtain a printed wiring board having an interlayer insulating layer formed therein. A cross section of the interlayer insulating layer of the resulting printed wiring board was observed with a field emission scanning electron microscope (a trade name: S-4700, manufactured by Hitachi, Ltd.), thereby confirming the presence or absence of resin separation. The observation by the field emission scanning electron microscope was performed at an accelerating voltage of 10 V and an emission current of 10 µA.

In the cross-sectional SEM photograph of the interlayer insulating layer, the case where the resin separation was confirmed (the case where a distinct interface between the resins was confirmed in the interlayer insulating layer) was designated as "C"; the case where though the resin separation was confirmed, it was at a level causing no problem in practical use was designated as "B"; and the case where the resin separation was not confirmed was designated as "A". In this evaluation, the case of "A" is preferred.
[Measurement Method of Dielectric Tangent]

The measurement of dielectric tangent was carried out in the same method as that described in the Examples regarding the embodiment capable of solving the problem [II].
[Measurement Method of Coefficient of Thermal Expansion]

The measurement of coefficient of thermal expansion was carried out in the same method as that described in the Examples regarding the embodiment capable of solving the problem [II].
[Measurement Method of Surface Roughness]

The measurement of surface roughness was carried out in the same method as that described in the Examples regarding the embodiment capable of solving the problem [II].
[Measurement Method of Adhesive Strength to Plated Copper]

The measurement of adhesive strength to plated copper was carried out in the same method as that described in the Examples regarding the embodiment capable of solving the problem [II].

TABLE 4

| | | | Example [III] | | | |
|---|---|---|---|---|---|---|
| | | | 1 | 2 | 3 | 4 |
| Number of composite film | | | 1 | 2 | 3 | 4 |
| Kind of varnish for first resin layer | | | A | B | C | D |
| Blending composition of varnish for first resin layer | Thermosetting resin (A) | Polyimide compound (a1) (part by mass) | 17.0 | 17.0 | 17.0 | 17.0 |
| | Inorganic filler (B) | (part by mass) | 77.3 | 77.3 | 77.3 | 77.3 |
| | Conjugated diene-based elastomer (C') | POLYVEST 110 (part by mass) | 4.26 | | | |
| | | POLYVEST 130 (part by mass) | | 4.26 | | |
| | | POLYVEST 75MA (part by mass) | | | 4.26 | |

TABLE 4-continued

|  |  |  |  |  |  |  |
|---|---|---|---|---|---|---|
|  |  | POLYVEST EP 120MA (part by mass) |  |  |  | 4.26 |
|  |  | Ricon 130MA8 (part by mass) |  |  |  |  |
|  |  | Ricon 131MA5 (part by mass) |  |  |  |  |
|  |  | Ricon 184MA6 (part by mass) |  |  |  |  |
|  |  | Ricon 181 (part by mass) |  |  |  |  |
|  | Flame retardant | (part by mass) | 1.0 | 1.0 | 1.0 | 1.0 |
|  | Antioxidant | (part by mass) | 0.1 | 0.1 | 0.1 | 0.1 |
|  | Fluidity controlling agent | (part by mass) | 0.1 | 0.1 | 0.1 | 0.1 |
|  | Curing accelerator | PERBUTYL P (phr) (*1) | 0.2 | 0.2 | 0.2 | 0.2 |
|  |  | G8009L (phr) (*2) | 0.04 | 0.04 | 0.04 | 0.04 |
| Evaluation results | Handling properties of film | Immediately after exfoliating protective film | A | A | A | A |
|  |  | After elapsing 24 hours at 25° C. | A | A | A | A |
|  | Presence or absence of resin separation after lamination |  | B | B | A | A |
|  | Dielectric tangent (5 GHz) |  | 0.0030 | 0.0030 | 0.0035 | 0.0037 |
|  | Coefficient of thermal expansion (ppm/° C.) |  | 18 | 18 | 18 | 18 |
|  | Surface roughness (nm) |  | 120 | 120 | 110 | 110 |
|  | Plating peel strength (kN/m) |  | 0.55 | 0.54 | 0.55 | 0.54 |

|  |  |  | Reference Example [III] | | | |
|---|---|---|---|---|---|---|
|  |  |  | 1 | 2 | 3 | 4 |
| Number of composite film |  |  | 5 | 6 | 7 | 8 |
| Kind of varnish for first resin layer |  |  | E | F | G | H |
| Blending composition of varnish for first resin layer | Thermosetting resin (A) | Polyimide compound (a1) (part by mass) | 17.0 | 17.0 | 17.0 | 17.0 |
|  | Inorganic filler (B) | (part by mass) | 77.3 | 77.3 | 77.3 | 77.3 |
|  | Conjugated diene-based elastomer (C') | POLYVEST 110 (part by mass) |  |  |  |  |
|  |  | POLYVEST 130 (part by mass) |  |  |  |  |
|  |  | POLYVEST 75MA (part by mass) |  |  |  |  |
|  |  | POLYVEST EP 120MA (part by mass) |  |  |  |  |
|  |  | Ricon 130MA8 (part by mass) | 4.26 |  |  |  |
|  |  | Ricon 131MA5 (part by mass) |  | 4.26 |  |  |
|  |  | Ricon 184MA6 (part by mass) |  |  | 4.26 |  |
|  |  | Ricon 181 (part by mass) |  |  |  | 4.26 |
|  | Flame retardant | (part by mass) | 1.0 | 1.0 | 1.0 | 1.0 |
|  | Antioxidant | (part by mass) | 0.1 | 0.1 | 0.1 | 0.1 |
|  | Fluidity controlling agent | (part by mass) | 0.1 | 0.1 | 0.1 | 0.1 |
|  | Curing accelerator | PERBUTYL P (phr) (*1) | 0.2 | 0.2 | 0.2 | 0.2 |
|  |  | G8009L (phr) (*2) | 0.04 | 0.04 | 0.04 | 0.04 |
| Evaluation results | Handling properties of film | Immediately after exfoliating protective film | A | A | A | A |
|  |  | After elapsing 24 hours at 25° C. | A | A | A | A |
|  | Presence or absence of resin separation after lamination |  | A | A | A | C |
|  | Dielectric tangent (5 GHz) |  | 0.0040 | 0.0040 | 0.0045 | 0.0035 |
|  | Coefficient of thermal expansion (ppm/° C.) |  | 18 | 18 | 18 | 18 |
|  | Surface roughness (nm) |  | 153 | 155 | 160 | 151 |
|  | Plating peel strength (kN/m) |  | 0.56 | 0.54 | 0.55 | 0.53 |

(*1): Charged amount (phr) based on 100 parts by mass of the total amount of the amount of the raw material maleimide compound, as converted from the charged amount of the polyimide compound (a1), and the amount of the conjugated diene-based elastomer (C')
(*2): Charged amount (phr) based on 100 parts by mass of the amount of the raw material maleimide compound as converted from the charged amount of the polyimide compound (a1)

The details of the respective components shown in Table 4 are as follows.

Polyimide compound (a1): Polyimide compound produced in Production Example 1[III]
Inorganic filler (B): Aminosilane coupling agent-treated silica (methyl isobutyl ketone dispersion liquid having a solid content concentration of 70% by mass, manufactured by Admatechs Co., Ltd., average particle diameter: 0.5 μm)
POLYVEST (registered trademark) 110: Polybutadiene-based elastomer (a trade name, manufactured by Evonik; number of maleic anhydride-modified groups: 0, (1,4-trans body)+(1,4-cis body): 99%)
POLYVEST (registered trademark) 130: Polybutadiene-based elastomer (a trade name, manufactured by Evonik; number of maleic anhydride-modified groups: 0, (1,4-trans body)+(1,4-cis body): 99%)
POLYVEST (registered trademark) 75MA: Polybutadiene-based elastomer (a trade name, manufactured by Evonik; number of maleic anhydride-modified groups: 2, (1,4-trans body)+(1,4-cis body): 99%)
POLYVEST (registered trademark) 120MA: Polybutadiene-based elastomer (a trade name, manufactured by Evonik; number of maleic anhydride-modified groups: 4, (1,4-trans body)+(1,4-cis body): 99%)
Ricon (registered trademark) 130MA8: Polybutadiene-based elastomer (a trade name, manufactured by Cray Valley; number of maleic anhydride-modified groups: 2, (1,4-trans body)+(1,4-cis body): 72%)
Ricon (registered trademark) 131MA5: Polybutadiene-based elastomer (a trade name, manufactured by Cray Valley; number of maleic anhydride-modified groups: 2, (1,4-trans body)+(1,4-cis body): 72%)
Ricon (registered trademark) 184MA6: Polybutadiene-based elastomer (a trade name, manufactured by Cray Valley; number of maleic anhydride-modified groups: 6, (1,4-trans body)+(1,4-cis body): 72%)
Ricon (registered trademark) 181: Polybutadiene-based elastomer (a trade name, manufactured by Cray Valley; number of maleic anhydride-modified groups: 0, (1,4-trans body)+(1,4-cis body): 72%)
Flame retardant: 1,3-Phenylenebis(di-2,6-xylenyl phosphate) (manufactured by Daihachi Chemical Industry Co., Ltd.)

Antioxidant: 4,4'-Butylidenebis-(6-t-butyl-3-methylphenol) (manufactured by Mitsubishi Chemical Corporation)

Fluidity controlling agent: Silicon-based surface controlling agent (xylene solution having a solid content concentration of 25% by mass, manufactured by BYK Japan KK)

PERBUTYL P: α,α'-Di(tert-butylperoxy)diisopropylbenzene (a trade name, manufactured by NOF Corporation)

G8009L: Isocyanate-masked imidazole (a trade name, manufactured by Dai-ichi Kogyo Seiyaku Co., Ltd.)

From Table 4, it is noted that the composite films of the Examples are excellent in the handling properties of film; and that the resin sheets obtained by using the composite films of the Examples are small in the dielectric tangent and low in the coefficient of thermal expansion. In addition, it is noted that in the printed wiring boards obtained by using the composite films of the Examples, in spite of having a smooth surface (low surface roughness (Ra)), when provided with the second resin layer that is an adhesive layer, they have an interlayer insulating layer with excellent adhesive strength to plated copper, and hence, they are suitable for the formation of a fine wiring.

Furthermore, effects which are brought when the polyimide compound (a1) contains a structural unit derived from an aliphatic maleimide compound are proven by the following Examples, but it should be construed that the present invention is by no means limited by these Examples.

(Production Examples A-1 to A-5: Production of Polyimide Compound (a1))

In a glass-made flask vessel having a volume of one liter, which was equipped with a thermometer, a reflux condenser, and a stirring device and which could be heated and cooled, the respective components shown in Table 5 were charged, and the contents were allowed to react with each other with stirring at a liquid temperature of 120° C. for 3 hours while refluxing. Thereafter, the reaction product was confirmed to have a weight average molecular weight shown in Table 5 by means of gel permeation chromatography (GPC), cooled, and then subjected to 200-mesh filtration to produce a polyimide compound (a1).

BMI-4000: 2,2-Bis(4-(4-maleimidophenoxy)phenyl)propane (aromatic maleimide compound, manufactured by Daiwa Fine Chemicals Co., Ltd., molecular weight between crosslinking sites: about 500)

BISANILINE M: 4,4'-[1,3-Phenylenebis(1-methylethylidene)]bisaniline (manufactured by Mitsui Fine Chemicals, Inc.)

Test Examples 1 to 7, Reference Test Example 1, and Comparison Test Example 1

<Production of Varnish for First Resin Layer (Layer A)>

Respective components shown in Table 6 were mixed in a blending amount mentioned therein and dissolved at room temperature by a high-speed rotary mixer.

After dissolution of the polyimide compound (a1) was confirmed through visual inspection, the remaining components were added, and the contents were dispersed by a nanomizer treatment, to obtain a resin composition (resin varnish for first resin layer) for the purpose of preparing a resin film.

<Production of Varnish for Second Resin Layer (Layer B)>

The same operations as in Production Example 8[I] were performed, to obtain a varnish for second resin layer.

<Production of Composite Film>

The thus obtained varnish for second resin layer was coated on a release-treated support (PET film, a trade name: CERAPEEL (registered trademark) SY(RX), manufactured by Toray Advanced Film Co., Ltd. (thickness: 38 μm)) by using a comma coater such that the thickness of the second resin layer after drying was 2.5 μm, followed by drying at 140° C. for 3 minutes, to form the second resin layer on the support. The varnish for first resin layer was coated on the second resin layer by using a comma coater such that the thickness of the first resin layer after drying was 27.5 μm, followed by drying at 90° C. for 2 minutes. Subsequently, the resultant was wound up in a roll state while sticking a polypropylene film having a thickness of 15 μm serving as a protective film onto the surface of the first resin layer, to obtain a composite film having a support and a protective film.

Using the composite film, the dielectric tangent, the surface roughness, and the plating peel strength were evalu-

TABLE 5

| Production of polyimide compound (a1) | | Production Example | | | | |
|---|---|---|---|---|---|---|
| | | A-1 | A-2 | A-3 | A-4 | A-5 |
| Aliphatic maleimide compound | BMI-TMH | 149 | 276 | 385 | 1,870 | — |
| Aromatic maleimide compound | BMI-400 | 1,868 | 1,730 | 1,612 | — | 2,030 |
| Diamine compound | BISANILINE M | 258 | 269 | 278 | 405 | 245 |
| Organic solvent | Propylene glycol monomethyl ether | 1,225 | 1,225 | 1,225 | 1,225 | 1,225 |
| Content of aliphatic maleimide compound in polyimide compound (a1) (% by mass) | | 1.0 | 2.0 | 3.0 | 14.0 | 0 |
| Weight average molecular weight | | 3,000 | 3,000 | 3,000 | 3,000 | 3,000 |

(Unit: part by mass)

The details of the respective components shown in Table 5 are as follows.

BMI-TMH: 1,6-Bismaleimido-(2,2,4-trimethyl)hexane (manufactured by Daiwa Fine Chemicals Co., Ltd., molecular weight between crosslinking sites: about 1,500)

ated according to the methods described in the Examples regarding the embodiment capable of solving the problem [I] of the present invention. In addition, the handling properties of film were evaluated according to the methods described in the Examples regarding the embodiment capable of solving the problem [II] of the present invention.

The results are shown in Table 6.

TABLE 6

| | | | Test Example | | | | | |
|---|---|---|---|---|---|---|---|---|
| | | | 1 | 2 | 3 | 4 | 5 | 6 |
| Blending composition of varnish for first resin layer | Thermosetting resin (A) | A-1 (part by mass) | 17 | | | | | |
| | | A-2 (part by mass) | | 17 | | | | |
| | | A-3 (part by mass) | | | 17 | 17 | 17 | |
| | | A-4 (part by mass) | | | | | | 17 |
| | | A-5 (part by mass) | | | | | | |
| | Maleimide resin | BMI-4000 (part by mass) | | | | | | |
| | | BMI-5100 (part by mass) | | | | | | |
| | Inorganic filler (B) | (part by mass) | 77 | 77 | 77 | 77 | 77 | 77 |
| | Elastomer (C) | POLYVEST 75MA (part by mass) | 4 | 4 | 4 | | | 4 |
| | | Ricon 130 MA8 (part by mass) | | | | 4 | | |
| | | H1043 | | | | | 4 | |
| | | Ricon 181 (part by mass) | | | | | | |
| | Flame retardant | (part by mass) | 1.0 | 1.0 | 1.0 | 1.0 | 1.0 | 1.0 |
| | Antioxidant | (part by mass) | 0.1 | 0.1 | 0.1 | 0.1 | 0.1 | 0.1 |
| | Fluidity controlling agent | (part by mass) | 0.1 | 0.1 | 0.1 | 0.1 | 0.1 | 0.1 |
| | Curing accelerator | PERBUTYL P (part by mass) | 0.2 | 0.2 | 0.2 | 0.2 | 0.2 | 0.2 |
| | | G8009L (part by mass) | 0.04 | 0.04 | 0.04 | 0.04 | 0.04 | 0.04 |
| Evaluation results | Dielectric tangent (5 GHz) | | 0.0040 | 0.0038 | 0.0035 | 0.0036 | 0.0040 | 0.0030 |
| | Handling properties of film | Immediately after exfoliating protective film | B | A | A | A | B | A |
| | | After elapsing 24 hours at 25° C. | B | A | A | A | B | A |
| | Surface roughness (nm) | | 140 | 137 | 138 | 150 | 140 | 137 |
| | Plating peel strength (kN/m) | | 0.55 | 0.54 | 0.56 | 0.54 | 0.55 | 0.54 |

| | | | Test Example 7 | Reference Test Example 1 | Comparison Test Example 1 |
|---|---|---|---|---|---|
| Blending composition of varnish for first resin layer | Thermosetting resin (A) | A-1 (part by mass) | 17 | | |
| | | A-2 (part by mass) | | | |
| | | A-3 (part by mass) | | | |
| | | A-4 (part by mass) | | | |
| | | A-5 (part by mass) | | 17 | |
| | Maleimide resin | BMI-4000 (part by mass) | | | 8.5 |
| | | BMI-5100 (part by mass) | | | 8.5 |
| | Inorganic filler (B) | (part by mass) | 77 | 77 | 77 |
| | Elastomer (C) | POLYVEST 75MA (part by mass) | | 4 | 4 |
| | | Ricon 130 MA8 (part by mass) | | | |
| | | H1043 | | | |
| | | Ricon 181 (part by mass) | 4 | | |
| | Flame retardant | (part by mass) | 1.0 | 1.0 | 1.0 |
| | Antioxidant | (part by mass) | 0.1 | 0.1 | 0.1 |
| | Fluidity controlling agent | (part by mass) | 0.1 | 0.1 | 0.1 |
| | Curing accelerator | PERBUTYL P (part by mass) | 0.2 | 0.2 | 0.2 |
| | | G8009L (part by mass) | 0.04 | 0.04 | 0.04 |
| Evaluation results | Dielectric tangent (5 GHz) | | 0.0038 | 0.0050 | 0.0045 |
| | Handling properties of film | Immediately after exfoliating protective film | A | C | B |
| | | After elapsing 24 hours at 25° C. | A | C | B |
| | Surface roughness (nm) | | 138 | 140 | 130 |
| | Plating peel strength (kN/m) | | 0.46 | 0.55 | 0.59 |

(Unit: part by mass; the amount means an amount as expressed in terms of a solid content in the case of the solution)

The details of the respective components shown in Table 6 are as follows.

A-1: Polyimide compound produced in Production Example A-1

A-2: Polyimide compound produced in Production Example A-2

A-3: Polyimide compound produced in Production Example A-3

A-4: Polyimide compound produced in Production Example A-4

A-5: Polyimide compound produced in Production Example A-5

BMI-4000: 2,2-Bis(4-(4-maleimidophenoxy)phenyl)propane (aromatic maleimide compound, manufactured by Daiwa Fine Chemicals Co., Ltd., molecular weight between crosslinking sites: about 500)

BMI-5100: 3,3'-Dimethyl-5,5'-diethyl-4,4'-diphenylmethanebismaleimide (manufactured by Daiwa Fine Chemicals Co., Ltd.)

Inorganic filler (B): Silica (methyl isobutyl ketone dispersion liquid having a solid content concentration of 70% by mass, manufactured by Admatechs Co., Ltd.)

POLYVEST (registered trademark) 75MA: Polybutadiene-based elastomer (manufactured by Evonik)

Ricon (registered trademark) 130MA8: Polybutadiene-based elastomer (manufactured by Cray Valley)

H1043: Styrene-based thermoplastic elastomer (a trade name: TUFTEC H1043, manufactured by Asahi Kasei Chemicals Corporation)

Ricon (registered trademark) 181: Polybutadiene-styrene copolymer (manufactured by Cray Valley)

Flame retardant: 1,3-Phenylenebis(di-2,6-xylenyl phosphate) (manufactured by Daihachi Chemical Industry Co., Ltd.)

Antioxidant: 4,4'-Butylidenebis-(6-t-butyl-3-methylphenol) (manufactured by Mitsubishi Chemical Corporation)

Fluidity controlling agent: Polyester-modified polydimethylsiloxane (xylene solution having a solid content concentration of 25% by mass, manufactured by BYK Japan KK)

PERBUTYL P: α,α'-Bis(tert-butylperoxy)diisopropylbenzene (a trade name, manufactured by NOF Corporation)

G8009L: Isocyanate-masked imidazole (a trade name, manufactured by Dai-ichi Kogyo Seiyaku Co., Ltd.)

From Table 6, in the Test Examples taking the embodiment in which the polyimide compound (a1) contains a structural unit derived from an aliphatic maleimide compound, there were revealed the results such that as compared by the Reference Test Example and Comparison Test Example, not only the dielectric tangent is small, but also the handling properties of film are excellent. Furthermore, in the foregoing Test Examples, in spite of having a smooth surface (low surface roughness (Ra)), an interlayer insulating layer with excellent adhesive strength to plated copper (peel strength: 0.45 kN/m or more) is provided, and hence, it may be said that the composite film of the present invention is suitable for the formation of a fine wiring.

INDUSTRIAL APPLICABILITY

The composite film of the present invention is low in the dielectric tangent, excellent in the embedding properties relative to unevenness of a circuit, etc., and excellent in surface smoothness, and has high adhesion to plated copper. In consequence, the composite film and printed wiring board of the present invention are useful for electric appliances, such as computers, mobile phones, digital cameras, and television receivers, vehicles, such as motorcycles, automobiles, trains, ships, and aircrafts, and so on.

REFERENCE SIGNS LIST

1: Layer A (first resin layer)
2: Layer B (second resin layer)
3: Support
4: Protective film

The invention claimed is:

1. A composite film for electronic device using high frequency band signals, comprising:
    a layer A having a minimum melt viscosity at 80 to 150° C. of 100 to 4,000 Pa·s, wherein the layer A contains a polyimide compound having a structural unit derived from a maleimide compound and a structural unit derived from a diamine compound; and an inorganic filler, and wherein the structural unit derived from a maleimide compound contains a structural unit derived from an aliphatic maleimide compound having a carbon number between imide groups of 6 to 40; and
    a layer B having a minimum melt viscosity at 80 to 150° C. of 63,000 Pa·s or more.

2. The composite film for electronic device using high frequency band signals according to claim 1, wherein a thickness of the layer B is from 1 to 5 μm.

3. The composite film for electronic device using high frequency band signals according to claim 1, where a total thickness of the layer A and the layer B is from 15 to 50 μm.

4. The composite film for electronic device using high frequency band signals according to claim 1, wherein the layer B contains a polyfunctional epoxy resin and a phenolic hydroxy group-containing polybutadiene-modified polyamide resin.

5. The composite film for electronic device using high frequency band signals according to claim 1, which exhibits a dielectric tangent at 5 GHz of 0.005 or less in terms of a cured material thereof.

6. A printed wiring board comprising a cured material of the composite film for electronic device according to claim 1.

7. The composite film for electronic device using high frequency band signals according to claim 1, wherein the content of the structural unit derived from an aliphatic maleimide compound relative to the total content of the structural units derived from the maleimide compound is preferably 5 to 50% by mass in the polyimide compound.

8. The composite film for electronic device using high frequency band signals according to claim 1, wherein the content of the structural unit derived from an aliphatic maleimide compound relative to the total content of the structural units derived from the maleimide compound is preferably 10 to 40% by mass in the polyimide compound.

9. The composite film for electronic device using high frequency band signals according to claim 1, wherein layer B having a minimum melt viscosity at 80 to 150° C. of 63,000 to 70,000 Pa·s.

10. The composite film for electronic device using high frequency band signals according to claim 1, wherein the structural unit derived from a maleimide compound contains a structural unit derived from an aliphatic maleimide compound having a carbon number between imide groups of 7 to 30.

11. A method of producing a printed wiring board, comprising:
    a step of using the composite film for electronic device according to claim 1 and sticking the side of the layer A of the composite film for electronic device onto a board having a difference in level on a surface thereof due to a circuit or a component, to fill the difference in level;
    a step of curing the layer A and the layer B of the composite film for electronic device; and
    a step of forming a circuit on a surface on the side of the layer B of the composite film for electronic device by a semi-additive method.

12. A method of producing a printed wiring board, comprising a step of laminating the composite film for electronic device according to claim 1 on one surface or both surfaces of a base material.

* * * * *